United States Patent
Donovan et al.

(10) Patent No.: US 9,285,438 B2
(45) Date of Patent: Mar. 15, 2016

(54) CIRCUITS AND METHODS FOR PROCESSING SIGNALS GENERATED BY A PLURALITY OF MAGNETIC FIELD SENSING ELEMENTS

(75) Inventors: Mark J. Donovan, Derry, NH (US); Bryan Cadugan, Bedford, NH (US)

(73) Assignee: Allegro Microsystems, LLC, Worcester, MA (US)

(*) Notice: Subject to any disclaimer, the term of this patent is extended or adjusted under 35 U.S.C. 154(b) by 1130 days.

(21) Appl. No.: 13/247,139

(22) Filed: Sep. 28, 2011

(65) Prior Publication Data

US 2013/0080087 A1   Mar. 28, 2013

(51) Int. Cl.
| | | |
|---|---|---|
| *G01R 33/06* | (2006.01) | |
| *G01R 33/07* | (2006.01) | |
| *G01R 33/00* | (2006.01) | |
| *G01D 5/14* | (2006.01) | |

(52) U.S. Cl.
CPC .............. *G01R 33/077* (2013.01); *G01D 5/145* (2013.01); *G01R 33/0029* (2013.01); *G01R 33/066* (2013.01)

(58) Field of Classification Search
CPC ............ G01B 7/30; G01B 7/14; G01B 21/22; G01R 33/093; G01R 33/09; G01D 5/145; G01D 5/12
USPC ............. 324/207.11, 207.12, 207.13, 207.14, 324/207.15, 207.21, 207.22, 207.23, 324/207.25, 202, 225, 244, 260, 207.2; 702/145, 146, 147, 148, 150, 151; 338/32 R, 32 H; 365/9; 257/E43.001–E43.003, E43.007
See application file for complete search history.

(56) References Cited

U.S. PATENT DOCUMENTS

| | | | |
|---|---|---|---|
| 4,668,914 | A | 5/1987 | Kersten et al. |
| 4,761,569 | A | 8/1988 | Higgs |
| 4,829,352 | A | 5/1989 | Popovic et al. |
| 5,541,506 | A | 7/1996 | Kawakita et al. |

(Continued)

FOREIGN PATENT DOCUMENTS

| | | |
|---|---|---|
| CN | 101995558 A | 3/2011 |
| CN | 102171588 A | 8/2011 |

(Continued)

OTHER PUBLICATIONS

Drljaca, et al.; "Nonlinear Effects in Magnetic Angular Position Sensor With Integrated Flux Concentrator;" Proc. 23$^{rd}$ International Conference on Microelectronics (MIEL 2002); vol. 1; NIS; Yugoslavia; May 12-15, 2002; pp. 223-226.

(Continued)

*Primary Examiner* — Patrick Assouad
*Assistant Examiner* — Taqi Nasir
(74) *Attorney, Agent, or Firm* — Daly, Crowley, Mofford & Durkee, LLP

(57) ABSTRACT

Circuits and methods provide an ability to track a direction of a magnetic field, and, more particular, to track a direction of a rapidly rotating magnetic field. The circuits and methods use a plurality of magnetic field sensing elements, for example, as may be embodied in a circular vertical Hall (CVH) sensing element. However, the circuits and methods can track the direction of the sensed magnetic field by processing at any time fewer than all of the plurality of magnetic field sensing elements, for example, one or two of the plurality of magnetic field sensing elements.

30 Claims, 15 Drawing Sheets

(56) References Cited

U.S. PATENT DOCUMENTS

| | | | |
|---|---|---|---|
| 5,572,058 A | 11/1996 | Biard | |
| 5,612,618 A | 3/1997 | Arakawa | |
| 5,619,137 A | 4/1997 | Vig et al. | |
| 5,621,319 A | 4/1997 | Bilotti et al. | |
| 5,657,189 A | 8/1997 | Sandhu | |
| 5,694,038 A | 12/1997 | Moody et al. | |
| 5,831,513 A | 11/1998 | Lue | |
| 5,844,411 A | 12/1998 | Vogt | |
| 5,942,895 A | 8/1999 | Popovic et al. | |
| 6,064,199 A | 5/2000 | Walter et al. | |
| 6,064,202 A | 5/2000 | Steiner et al. | |
| 6,073,043 A | 6/2000 | Schneider | |
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,424,147 B1 * | 7/2002 | Kato | B62D 15/02 324/207.2 |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,184,876 B2 | 2/2007 | Teulings et al. | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,797,604 B2 | 9/2010 | Lee et al. | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 8,321,173 B2 * | 11/2012 | Wallance | G01B 7/003 600/302 |
| 2002/0114269 A1 | 8/2002 | Onggosanusi et al. | |
| 2005/0225318 A1 * | 10/2005 | Bailey | G01H 1/003 324/207.12 |
| 2006/0011999 A1 | 1/2006 | Schott et al. | |
| 2007/0029998 A1 | 2/2007 | Popovic et al. | |
| 2007/0105244 A1 | 5/2007 | Okita | |
| 2008/0100285 A1 | 5/2008 | Matsumoto et al. | |
| 2009/0001965 A1 | 1/2009 | Ausserlechner et al. | |
| 2009/0121707 A1 | 5/2009 | Schott | |
| 2009/0174395 A1 | 7/2009 | Thomas et al. | |
| 2010/0026282 A1 | 2/2010 | Kaita et al. | |
| 2010/0102809 A1 | 4/2010 | May | |
| 2010/0133632 A1 | 6/2010 | Schott | |
| 2010/0156397 A1 | 6/2010 | Yabusaki et al. | |
| 2010/0164491 A1 | 7/2010 | Kejik et al. | |
| 2010/0181993 A1 | 7/2010 | Fernandez et al. | |
| 2011/0031965 A1 | 2/2011 | Saruki et al. | |
| 2011/0037459 A1 * | 2/2011 | Okada | G01D 5/145 324/207.25 |
| 2011/0248708 A1 | 10/2011 | Thomas et al. | |
| 2011/0298447 A1 | 12/2011 | Foletto et al. | |
| 2012/0299588 A1 * | 11/2012 | Petrie | G01R 33/077 324/251 |

FOREIGN PATENT DOCUMENTS

| | | |
|---|---|---|
| CN | 102193073 A | 9/2011 |
| DE | 10 2005 014 509 B4 | 10/2006 |
| DE | 10 2006 037 226 A1 | 2/2008 |
| DE | 10 2007 036 984 A1 | 1/2009 |
| DE | 10 2010 010 560 B3 | 9/2011 |
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| TW | 200643376 | 12/2006 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2005/029106 A1 | 3/2005 |
| WO | WO 2006/056289 A1 | 6/2006 |
| WO | WO 2006/074989 A2 | 7/2006 |
| WO | WO 2008 145662 A1 | 12/2008 |
| WO | WO 2008/145662 A1 | 12/2008 |
| WO | WO 2009/124969 A1 | 10/2009 |
| WO | WO 2013/017211 A1 | 2/2013 |

OTHER PUBLICATIONS

Taiwan Office Action dated Fabruwy 18, 2014; for TW Pat. App. No. 101132371; 7 pages.

Taiwan Office Action (English translation) dated Feb. 18, 2014; for TW Pat. App. No. 101132371; 8 pages.

Notice of Allowance dated Mar. 14, 2014; for U.S. Appl. No. 13/035,257; 7 pages.

Letter to Taiwan International Patent & Law Office dated Apr. 28, 2014; for Taiwan Pat. App. No. 101132371; 3 pages.

Email from Taiwan International Patent & Law Office dated May 16, 2014; for Taiwan Pat. App. No. 101132371; 2 pages.

Taiwan Response to Office Action (with claims in Taiwanese) filed May 16, 2015; for Taiwan Pat. App. No. 101132371; 14 pages.

Taiwan Claims (English transiation) as filed with Response to Office Action filed May 16, 2014; for Taiwan Pat. App. No. 101132371; 12 pages.

Notice of Allowance dated Jun. 11, 2014; from U.S. Appl. No. 13/113/603; 30 pages.

PCT Search Report and Written Opinion of the ISA; dated Sep. 6, 2013; for PCT Pat. App. No. PCT/US2012/024426; 11 pages.

Allegro Microsystems, Inc.; "High Precision Linear Hall Effect Sensor IC with a Push/Pull, Pulse Width Modulated Output;" A1351; pp. 1-23.

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik,.et al.; "Ultra Low-Power Angular Position Sensor for High-Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

(56) References Cited

OTHER PUBLICATIONS

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.
Melexis Microelectronic Integrated Systems; MLX90333; "Triaxis 3D-Joystick Position Sensor;" Data Sheet; Mar. 2009; 43 pages.
MEMSIC Corporation; AN-00MM-004; "Electronic Tilt Compensation;" Mar. 2008; 5 pages.
MEMSIC Corporation; AN-00MM-003; "Magnetic Sensor Calibration;" Mar. 2008; 5 pages.
MEMSIC Corporation; AN-00MM-002; "Magnetometer Soldering Methodology;" Jun. 2008; 2 pages.
MEMSIC Corporation; AN-00MM-001; "Magnetometer Fundamentals;" Jun. 2008; 6 pages.
MEMSIC Corporation; AN-00MM-005; "Magnetic Sensor Placement Guidelines;" Oct. 2008; 2 pages.
MEMSIC Corporation; MMC312xMQ; "Tri-axis Magnetic Sensor, with I$^2$C Interface;" Aug. 14, 2008; 9 pages.
MEMSIC Corporation; MMC314xMS; "Ultra Small 3-axis Magnetic Sensor, with I$^2$C Interface;" Mar. 31, 2010; 8 pages.
Micronas GmbH; "HAL® 3625 Programmable Direct Angle Sensor;" Product Information; Sep. 2009; 2 pages.
Final Office Action dated Oct. 30, 2013; for U.S. Appl. No. 13/035,257; 21 pages.
Petrie; "Circuit and Method for Processing Signals Generated by a Plurality of Sensors;" U.S. Appl. No. 13/035,257, filed Feb. 25, 2011; 52 pages.
Petrie; "Circuits and Methods for Processing a Signal Generated by a Plurality of Measuring Devices;" U.S. Appl. No. 13/113,603, filed May 23, 2011; 59 pages.
Petrie; "Circular Vertical Hall Mangetic Field Sensing Element and Method With a Plurality of Continuous Output Signals;" U.S. Appl. No. 13/035,243, filed Feb. 25, 2011; 56 pages.
PCT International Preliminary Report on Patentability and Written Opinion of the ISA dated Dec. 5, 2013; for PCT Pat. App. No. PCT/US2012/034892; 10 pages.
PCT Invitation to Pay Additional Fees with Partial Search Report; dated Feb. 6, 2013; for PCT Pat. App. No. PCT/US2012/052639; 7 pages.
Kaufmann et al.; "Novel Coupling Concept for Five-Contact Vertical Hall Devices;" 16th International Solid-State Sensors, Actuators and Microsystems (Transducers) Conference; Jun. 5-9, 2011; 4 sheets.
PCT International Preliminary Report on Patentability and Written Opinion of the ISA dated Apr. 10, 2014; for PCT Pat. App. No. PCT/US2012/052639; 19 pages.
PCT Search Report and Written Opinion of the ISA; dated May 7, 2012; for PCT Pat. App. No. PCT/US2012/024426; 12 pages.
Banjevic; "High Bandwidth CMOS Magnetic Sensors Based on the Miniaturized Circular Vertical Hall Device;" Sep. 2011; 153 pages.
Melexis MLX 90324; ""Under-the-Hood" Triaxis Rotary Position feat. SENT Protocol;" 3901090324 Data Sheet; Dec. 2008; 40 pages.
Response to Office Action dated Oct. 9, 2013 as filed on Feb. 10, 2014 for U.S. Appl. No. 13/113,603.
Office Action dated Jun. 3, 2013; for U.S. Appl. No. 13/035,257; 25 pages.
PCT Search Report and Written Opinion of the ISA; dated May 21, 2013; for PCT Pat. App. No. PCT/US2012/052639; 25 pages.
Email from Taiwan International Patent & Law Office dated Sep. 2, 2014; for Taiwan Pat. App. No. 101132371; 2 pages.
Taiwan Allowance Decision dated Aug. 27, 2014; for Taiwan Pat. App. No. 101132371; 2 pages.
Office Action; dated Oct. 9, 2013; for U.S. Appl. No. 13/113,603; 33 pages.
PCT Search Report and Written Opinion; dated Nov. 26, 2012; for PCT Pat. App. No. PCT/US2012/034892; 13 pages.
Response filed Aug. 20, 2013; to Office Action dated Jun. 3, 2013; for U.S. Appl. No. 13/035,257; 13 pages.
Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.
Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23.
Allegro Microsystems, Inc.; "A1360, A1361 and A1362 Data Sheet: Low-Noise Programmable Linear Hall Effect Sensors with Adjustable Bandwidth (50 *kHz* Maximum) and Analog Output;" published Mar. 18, 2008; pp. 1-25.
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designer's Perspective;" IEEE Electro International; Apr. 26-28, 1991; pp. 129-134.
Austria Microsystems; "AS5040 datasheet; 10-Bit Programmable Magnetic Rotary Encoder;" Revision 1.1; Jan. 2004; pp. 1-20.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; Allegro Microsystems, Inc.; "AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

(56) References Cited

OTHER PUBLICATIONS

Munter; "A Low-offset Spinning-current Hall Plate;" Sensors and Actuators, vol. A21-A23; Jan. 1990; pp. 743-746.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The 8$^{th}$ International Conference on Solid-State Sensors and Acutators, Physical vol. 53, Issues 1-3; May 1996; pp. 278-283.

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

SENSIMA technology sa; "CVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.

van der Meer; et al; "CMOS quad spinning-current Hall-sensor system for compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Voider; "The CORDIC Trigonometric Computing Technique;" The Institute of Radio Engineers, Inc.; IRE Transactions on Electronic Computers, vol. EC, Issue 3; Sep. 1959; pp. 226-230.

* cited by examiner

CIRCUITS AND METHODS FOR PROCESSING SIGNALS GENERATED BY A PLURALITY OF MAGNETIC FIELD SENSING ELEMENTS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits, and, more particularly, to an electronic circuit used with a plurality of magnetic field sensing elements that can rapidly identify an angle of a direction of a magnetic field sensed by the plurality of magnetic field sensing elements.

BACKGROUND OF THE INVENTION

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (and optionally a strength) of a magnetic field in a plane of the substrate.

Conventionally, all of the output signals from the plurality of vertical Hall elements within the CVH sensing element are needed in order to determine a direction of a magnetic field. Also conventionally, output signals from the vertical Hall elements of a CVH sensing element are generated sequentially, resulting in a substantial amount of time necessary to generate all of the output signals from the CVH sensing element. Thus, determination of the direction of the magnetic field can take a substantial amount of time.

Various parameters characterize the performance of magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

Another parameter that can characterize the performance of a CVH sensing element is the speed with which output signals from vertical Hall elements within the CVH sensing element can be sampled, and thus, the speed with which a direction of a magnetic field can be identified. Yet another parameter that can characterize the performance of a CVH sensing element is the resolution (e.g., angular step size) of the direction of the magnetic field that can be reported by the CVH sensing element.

As described above, the CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation, and/or a rotation speed, of the target object.

For reasons described above, a magnetic field sensor that uses a CVH sensing element may have a limit as to how rapidly the magnetic field sensor can identify the direction of a magnetic field, i.e., a rotation angle or rotation speed of a target object. Furthermore, the magnetic field sensor may provide an angular resolution that is too low (too large an angle step size).

Thus, it would be desirable to provide a magnetic field sensor that uses a CVH sensing element (or, more generally, a plurality of magnetic field sensing elements) that can more rapidly identify a direction of a magnetic field, and that can faster sense the direction of the magnetic field with a higher resolution, particularly when the direction of the magnetic field is rotating.

SUMMARY OF THE INVENTION

The present invention provides a magnetic field sensor that uses a CVH sensing element (or, more generally, a plurality of magnetic field sensing elements) that can more rapidly identify a direction of a magnetic field, and that can faster sense the direction of the magnetic field with a higher resolution, particularly when the direction of the magnetic field is rotating.

In accordance with one aspect of the present invention, a method of determining a direction of a directional magnetic field includes generating a table of values. Each value is related to a respective difference between an identified respective value along a sinusoid and a ninety-degree value along the sinusoid taken ninety degrees apart from the identified respective value. One of the identified respective values is at a peak of the sinusoid and other identified respective values are at selected phase increments along the sinusoid. The method also includes receiving the directional magnetic field with a plurality of magnetic field sensing elements generating a corresponding plurality of magnetic field sensing element signals. The method also includes identifying a peak magnetic field sensing element from among the plurality of magnetic field sensing elements that generates a largest one of the plurality of magnetic field sensing element signals as a peak magnetic field sensing element signal. The method also includes identifying a ninety degree magnetic field sensing element from among the plurality of magnetic field sensing elements that has a primary response axis about ninety degrees rotated from a direction of a primary response axis of the peak magnetic field sensing element, the ninety degree magnetic field sensing element generating a ninety degree magnetic field sensing element signal. The method also includes computing a difference between the peak magnetic field sensing element signal and the ninety degree magnetic field sensing element signal. The method also includes comparing the computed difference with the table of values to identify the direction of the directional magnetic field. At least one of the above steps is performed by a processor.

In accordance with another aspect of the present invention, a method of determining a direction of a directional magnetic field includes tracking the direction of the directional magnetic field, wherein the directional magnetic field has a first direction subject to a rotation to a second different direction. The tracking includes receiving the directional magnetic field with a plurality of magnetic field sensing elements generating a corresponding plurality of magnetic field sensing element signals. The tracking further includes converting a peak magnetic field sensing element signal from a peak magnetic field sensing element among the plurality of magnetic field sensing elements with a first analog-to-digital converter to generate a first converted signal, wherein the peak magnetic field sensing element signal is a largest magnetic field sensing element signal from among the plurality of magnetic field sensing element signals. The tracking also includes identifying a next peak magnetic field sensing element among the plurality of magnetic field sensing elements that is expected to generate a new largest magnetic field sensing element signal as a next peak magnetic field sensing element signal when the magnetic field rotates to the second different direction. The tracking also includes converting the next peak magnetic field sensing element signal with a second different analog-to-digital converter to generate a second converted signal. The tracking also includes calculating whether the direction of the magnetic field is closer to the first direction or to the second direction. At least one of the above steps is performed by a processor.

In accordance with another aspect of the present invention, an electronic circuit for determining a largest direction of a directional magnetic field includes an initialization processor coupled to receive a plurality of magnetic field sensing element signals generated by a corresponding plurality of magnetic field sensing elements. The initialization processor is configured to generate a table of values. Each value is related to a respective difference between an identified respective value along a sinusoid and a ninety-degree value along the sinusoid taken ninety degrees apart from the identified respective value, wherein one of the identified respective values is at a peak of the sinusoid and other identified respective values are at selected phase increments along the sinusoid. The electronic circuit further includes a find peak processor coupled to the initialization processor. The find peak processor is configured to identify a peak magnetic field sensing element from among the plurality of magnetic field sensing elements that generates a largest one of the plurality of magnetic field sensing element signals as a peak magnetic field sensing element signal. The electronic circuit further includes a track peak processor coupled to receive the table of values and coupled to receive the peak magnetic field sensing element signal. The track peak processor is configured to identify a ninety degree magnetic field sensing element from among the plurality of magnetic field sensing elements that has a primary response axis about ninety degrees rotated from the from a direction of a primary response axis of the peak magnetic field sensing element, the ninety degree magnetic field sensing element generating a ninety degree magnetic field sensing element signal. The track peak processor is also configured to compute a difference between the peak magnetic field sensing element signal and the ninety degree magnetic field sensing element signal. The track peak processor is also configured to compare the computed difference with the table of values to identify the direction of the magnetic field.

In accordance with another aspect of the present invention, an electronic circuit for determining a direction of a directional magnetic field that has a first direction subject to a rotation to a second different direction, includes a plurality of magnetic field sensing elements configured to generate a corresponding plurality of magnetic field sensing element signals responsive to the directional magnetic field. The electronic circuit also includes a first analog-to digital converter configured to convert a largest magnetic field sensing element signal as a peak magnetic field sensing element signal from a peak magnetic field sensing element to generate a first converted signal. The electronic circuit also includes a track peak processor configured to identify a second different magnetic sensing element among the plurality of magnetic field sensing elements and proximate to the identified peak magnetic field sensing element as a next peak magnetic field sensing element signal that is expected to generate a new largest magnetic field sensing element signal as a next peak magnetic field sensing element signal when the directional magnetic field rotates to the second different direction. The electronic circuit also includes a second analog-to-digital configured to convert the next peak magnetic field sensing element signal to generate a second converted signal. The track peak processor is coupled to receive the first and second converted signals and is further configured to calculate whether the direction of the magnetic field is closer to the first direction or to the second direction.

In accordance with another aspect of the present invention, a method of processing signals generated by a plurality of magnetic field sensing elements includes exposing the plurality of magnetic field sensing elements to a rotating magnetic field and recording maxima and minima signal values for each one of the plurality of magnetic field sensing elements. The method also includes selecting a first one of the plurality of magnetic field sensing elements as a basis magnetic field sensing element having a basis maximum signal value and a basis minimum signal value. The method also includes computing a plurality of initial offset correction values associated with the plurality of magnetic field sensing elements by computing a difference between the basis maximum signal value and the maximum value for each one of the maxima signal values. The method also includes correcting the signals generated by the plurality of magnetic field sensing elements by using the initial offset correction values. At least one of the above steps is performed by a processor.

In accordance with another aspect of the present invention, an electronic circuit for processing signals generated by a plurality of magnetic field sensing element includes an initialization processor coupled to receive the signals generated by a plurality of magnetic field sensing elements while the plurality of magnetic field sensing elements are exposed to a rotating magnetic field. The initialization processor is configured to select a first one of the plurality of magnetic field sensing elements as a basis magnetic field sensing element having a basis maximum signal value and a basis minimum signal value. The initialization processor is further configured to compute a plurality of initial offset correction values associated with the plurality of magnetic field sensing elements by computing a difference between the basis maximum signal value and the maximum value for each one of the maxima signal values. The initialization processor is further configured to correct the signals generated by the plurality of magnetic field sensing elements by using the initial offset correction values.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
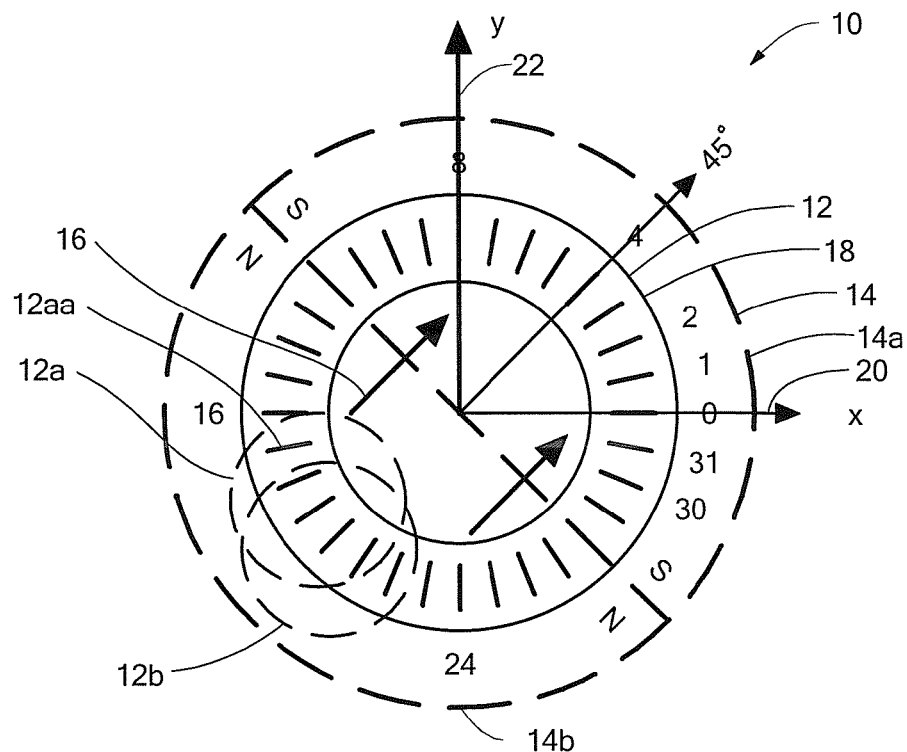
FIG. 1 is a pictorial showing a circular vertical Hall (CVH) sensing element having a plurality of vertical Hall elements arranged in a circle over a common implant region and a two pole magnet disposed close to the CVH sensing element.

Before describing the present invention, some introductory concepts and terminology are explained. As used herein, the term "sensing element" is used to describe a variety of types of electronic elements that can sense a characteristic of the environment. For example, sensing elements include, but are not limited to, pressure sensing elements, temperature sensing elements, motion sensing elements, light sensing elements, acoustic sensing elements, and magnetic field sensing elements.

As used herein, the term "sensor" is used to describe a circuit or assembly that includes a sensing element and other components. In particular, as used herein, the term "magnetic field sensor" is used to describe a circuit or assembly that includes a magnetic field sensing element and electronics coupled to the magnetic field sensing element.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While a circular vertical Hall (CVH) magnetic field sensing element, which has a plurality of vertical Hall magnetic field sensing elements, is described in examples below, it should be appreciated that the same or similar techniques and circuits apply to any type of sensing elements and to any type of sensors, i.e., to any type of measuring devices. In particular similar circuits and techniques apply to a plurality of separate vertical Hall elements, not arranged in a CVH structure.

Referring to FIG. 1, a circular vertical Hall (CVH) sensing element 12 includes a circular implant region 18 having a plurality of vertical Hall elements disposed thereon, of which a vertical Hall element 12a is but one example. Each vertical Hall element has a plurality of Hall element contacts (e.g., four or five contacts), of which a vertical Hall element contact 12aa is but one example.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a south side 14a and a north side 14b can be disposed over the CVH 12. The circular magnet 14 tends to generate a magnetic field 16 having a direction from the north side 14a to the south side 14b, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crank shaft or an automobile camshaft, and is subject to rotation relative to the CVH sensing element 12. With this arrangement, the CVH sensing element 12 in combination with an electronic circuit described below can generate a signal related to the angle of rotation of the magnet 14.

Figure 1A:
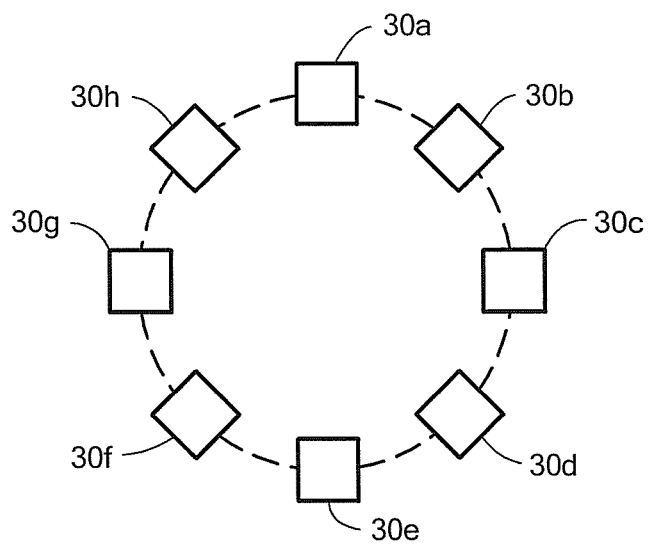
FIG. 1A is a pictorial showing a plurality of magnetic field sensing elements, for example, Hall elements, planar or vertical.

Referring now to FIG. 1A, a plurality of sensing elements 30a-30h (or alternatively, sensors), in a general case, can be any type of sensing elements, including, but not limited to, pressure sensing elements, temperature sensing elements, light sensing elements, acoustic sensing elements, and magnetic field sensing elements. The magnetic field sensing elements 30a-30h can be, for example, planar Hall elements, vertical Hall elements, or magnetoresistance elements. These elements can also be coupled to an electronic circuit described below. For embodiments where the sensing elements 30a-30h are vertical Hall elements, there can also be a magnet the same as or similar to the magnet 14 of FIG. 1, disposed proximate to the sensing elements 30a-30h.

Figure 2:
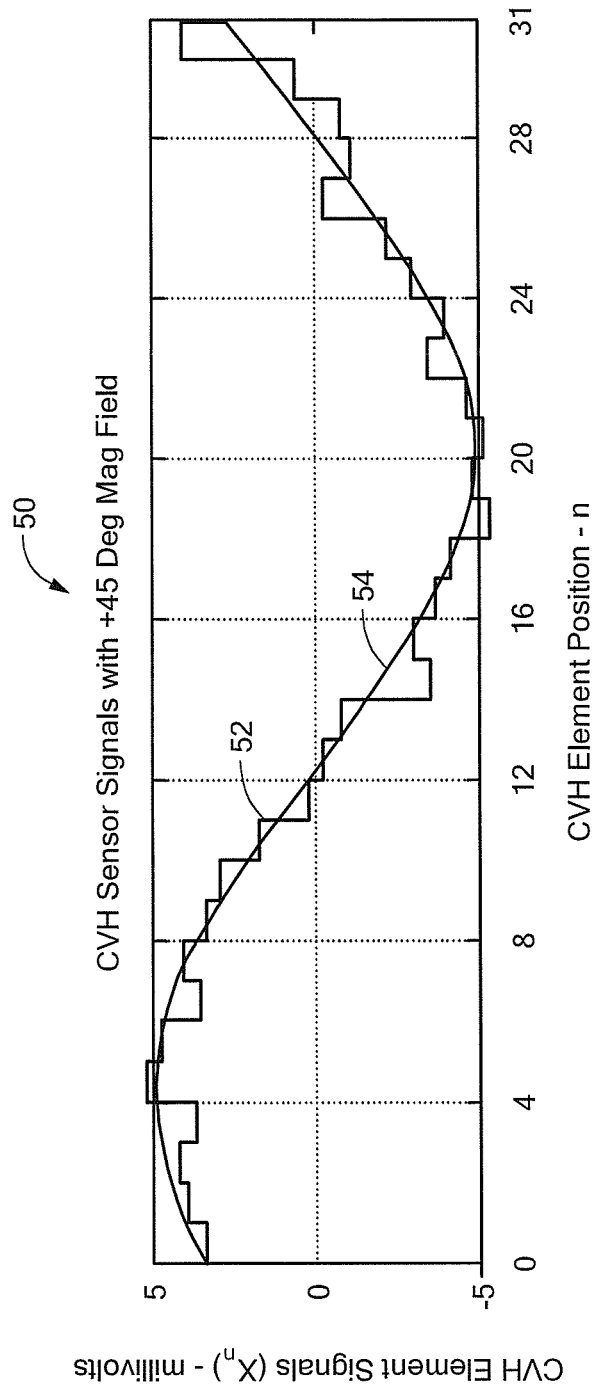
FIG. 2 is a graph showing an output signal as may be generated by the CVH sensing element of FIG. 1 or by the magnetic field sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element.

The graph 50 includes a signal 52 representative of output signal levels from the plurality of vertical Hall elements of the CVH taken sequentially with the magnetic field of FIG. 1 stationary and pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show the ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008/056517, groups of contacts of each vertical Hall element can be used in a multiplexed or chopped arrangement to generate chopped output signals from each vertical Hall element. Thereafter, or in parallel (i.e., at the same time), a new group of adjacent vertical Hall element contacts can be selected (i.e., a new vertical Hall element), which can be offset by one or more elements from the prior group. The new group can be used in the multiplexed or chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, i.e., from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008/056517, a phase of the signal 52 (e.g., a phase of the signal 54) can be found and can be used to identify the pointing direction of the magnetic field 16 of FIG. 1 relative to the CVH sensing element 12.

Figure 3:
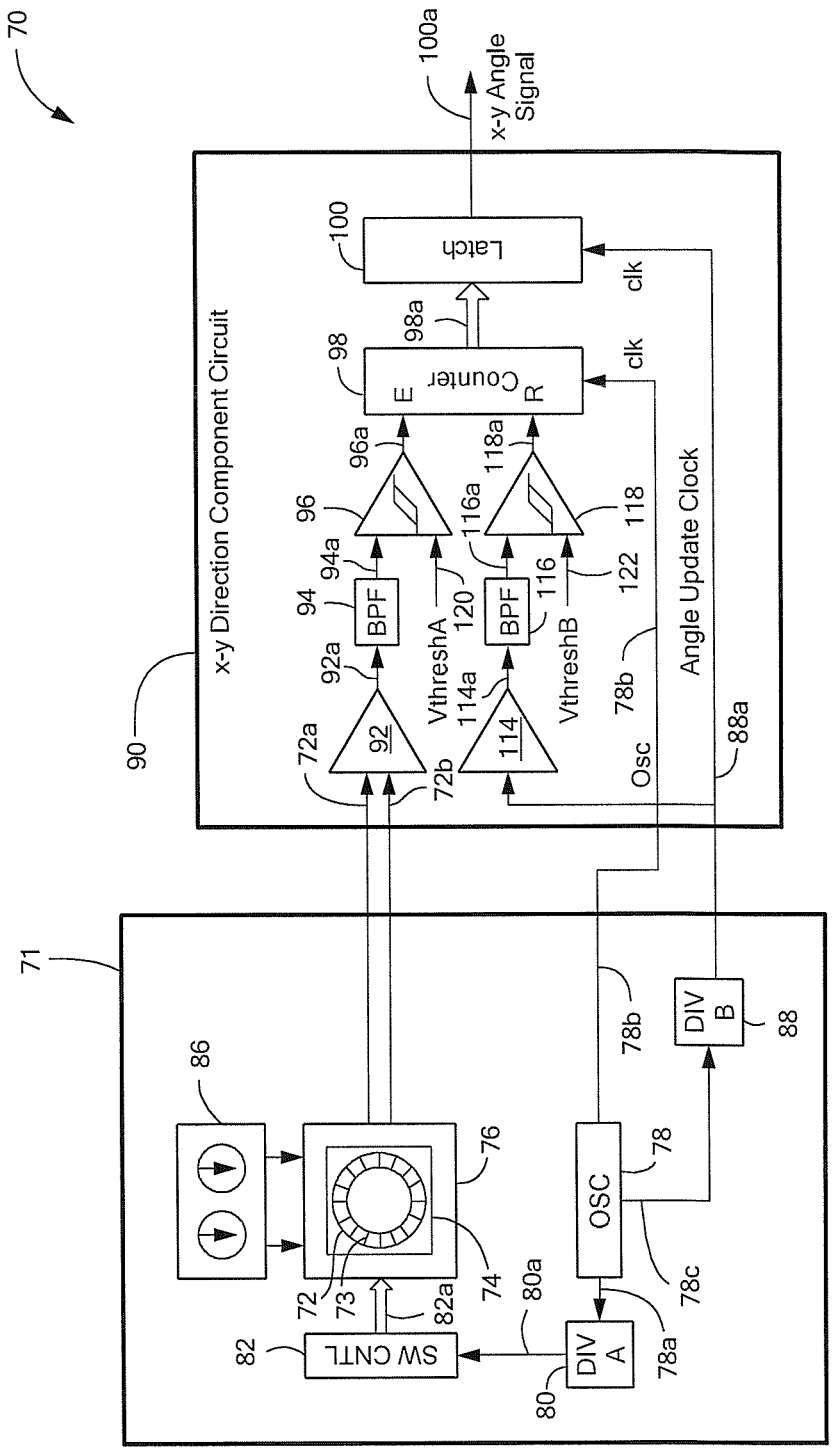
FIG. 3 is a block diagram showing an electronic circuit using a CVH sensing element to determine a direction of a sensed magnetic field.

Referring now to FIG. 3 a magnetic field sensor 70 includes a sensing portion 71. The sensing portion 71 can include a CVH sensing element 72 having a plurality of CVH sensing element contacts, e.g., a CVH sensing element contact 73. In some embodiments there are thirty-two vertical Hall elements in the CVH sensing element 72 and a corresponding thirty-two CVH sensing element contacts. In other embodiments there are sixty-four vertical Hall elements in the CVH sensing element 72 and a corresponding sixty-four CVH sensing element contacts.

A magnet (not shown) can be disposed proximate to the CVH sensing element 72, and can be coupled to a target object (not shown). The magnet can be the same as or similar to the magnet 14 of FIG. 1

As described above, the CVH sensing element 72 can have a plurality of vertical Hall elements, each vertical Hall element comprising a group of vertical Hall element contacts (e.g., five vertical Hall element contacts), of which the vertical Hall element contact 73 is but one example.

In some embodiments, a switching circuit 74 can provide sequential CVH differential output signals 72a, 72b from the CVH sensing element 72.

The CVH differential output signal 72a, 72b is comprised of sequential output signals taken one-at-a-time around the CVH sensing element 72, wherein each output signal is generated on a separate signal path and switched by the switching circuit 74 into the path of the differential output signal 72a, 72b. The signal 52 of FIG. 2 can be representative of the differential signal 72a, 72b. Therefore, the CVH differential output signal 72a, 72b can be represented as a switched set of CVH output signals $x_n=x_0$ to $x_{N-1}$, taken one at a time, where n is equal to a vertical Hall element position (i.e., a position of a group of vertical Hall element contacts that form a vertical Hall element) in the CVH sensing element 72, and where there are N such positions.

In one particular embodiment, the number of vertical Hall elements (each comprising a group of vertical Hall element contacts) in the CVH sensing element 72 is equal to the total number of sensing element positions, N. In other words, the CVH differential output signal 72a, 72b can be comprised of sequential output signals, wherein the CVH differential output signal 72a, 72b is associated with respective ones of the vertical Hall elements in the CVH sensing element 72 as the switching circuit 74 steps around the vertical Hall elements of the CVH sensing element 72 by increments of one, and N equals the number of vertical Hall elements in the CVH sensing element 72. However, in other embodiments, the increments can be by greater than one vertical Hall element, in which case N is less than the number of vertical Hall elements in the CVH sensing element 72.

In one particular embodiment, the CVH sensing element 72 has thirty-two vertical Hall elements, i.e., N=32, and each step is a step of one vertical Hall element contact position (i.e., one vertical Hall element position). However, in other embodiments, there can be more than thirty-two or fewer than thirty-two vertical Hall elements in the CVH sensing element 72, for example sixty-four vertical Hall elements. Also, the increments of vertical Hall element positions, n, can be greater than one vertical Hall element contact.

In some embodiments, another switching circuit 76 can provide the above-described "chopping" of groups of the vertical Hall elements within the CVH sensing element 72. Chopping will be understood to be an arrangement in which a group of vertical Hall element contacts, for example, five vertical Hall element contacts that form one vertical Hall element, are driven with current sources 86 in a plurality of different connection configurations, and signals are received from the group of vertical Hall element contacts in corresponding different configurations to generate the CVH differential output signal 72a, 72b. Thus, in accordance with each vertical Hall element position, n, there can be a plurality of sequential output signals during the chopping, and then the group increments to a new group, for example, by an increment of one vertical Hall element contact.

The sensing portion 71 can also include current sources 86 configured to drive the CVH sensing element 72 when the CVH sensing element 72.

While current sources 86 are shown, in other embodiments, the current sources 86 can be replaced by voltage sources.

The magnetic field sensor 70 includes an oscillator 78 that provides clock signals 78a, 78b, 78c, which can have the same or different frequencies. A divider 80 is coupled to receive the clock signal 78a and configured to generate a divided clock signal 80a. A switch control circuit 82 is coupled to receive the divided clock signal 80a and configured to generate switch control signals 82a, which are received by the switching circuits 74, 76 to control the sequencing around the CVH sensing element 72, and optionally, to control the chopping of groups of vertical Hall elements within the CVH sensing element 72 in ways described above.

The magnetic field sensor 70 can include a divider 88 coupled to receive the clock signal 78c and configured to generate a divided clock signal 88a, also referred to herein as an "angle update clock" signal.

The magnetic field sensor 70 also includes an x-y direction component circuit 90. The x-y direction component circuit 90 can include an amplifier 92 coupled to receive the CVH differential output signals 72a, 72b. The amplifier 92 is configured to generate an amplified signal 92a. A bandpass filter 94 is coupled to receive the amplified signal 92a and configured to generate a filtered signal 94a. A comparator 96, with or without hysteresis, is configured to receive the filtered signal 94a. The comparator 96 is also coupled to receive a threshold signal 120. The comparator 96 is configured to generate a thresholded signal 96a generated by comparison of the filtered signal 94a with the threshold signal 120.

The x-y direction component circuit 90 also includes an amplifier 114 coupled to receive the divided clock signal 88a. The amplifier 114 is configured to generate an amplified signal 114a. A bandpass filter 116 is coupled to receive the amplified signal 114a and configured to generate a filtered signal 116a. A comparator 118, with or without hysteresis, is coupled to receive the filtered signal 116a. The comparator 118 is also coupled to receive a threshold signal 122. The comparator 118 is configured to generate a thresholded signal 118a by comparison of the filtered signal 116a with the threshold signal 122.

The bandpass filters 94, 116 can have center frequencies equal to 1/T, where T is the time that it takes to sample all of the vertical Hall elements within the CVH sensing element 72.

It should be understood that the amplifier 114, the bandpass filter 116, and the comparator 118 provide a delay of the divided clock signal 88a in order to match a delay of the circuit channel comprised of the amplifier 92, the bandpass filter 94, and the comparator 96. The matched delays provide phase matching, in particular, during temperature excursions of the magnetic field sensor 70.

A counter 98 can be coupled to receive the thresholded signal 96a at an enable input, to receive the clock signal 78b at a clock input, and to receive the thresholded signal 118a at a reset input.

The counter 98 is configured to generate a phase signal 98a having a count representative of a phase difference between the thresholded signal 96a and the thresholded signal 118a.

The phase shift signal 98a is received by a latch 100 that is latched upon an edge of the divided clock signal 88a. The latch 100 is configured to generate a latched signal 100a, also referred to herein as an "x-y angle signal."

It will be apparent that the latched signal 100a is a multi-bit digital signal that has a value representative of a direction of an angle of the magnetic field experience by the CVH sensing element 72, and thus, an angle of the magnet and target object.

In some embodiments, the clock signals 78a, 78b, 78c each have a frequency of about 30 MHz, the divided clock signal 80a has a frequency of about 8 MHz, and the angle update clock signal 88a has a frequency of about 30 kHz. However in other embodiments, the initial frequencies can be higher or lower than these frequencies With the magnetic field sensor 70, it will be appreciated that an update rate of the x-y angle signal 100a occurs at a rate equivalent to a rate at which all of the vertical Hall elements within the CVH sensing element 72 are collectively sampled.

Figure 4:
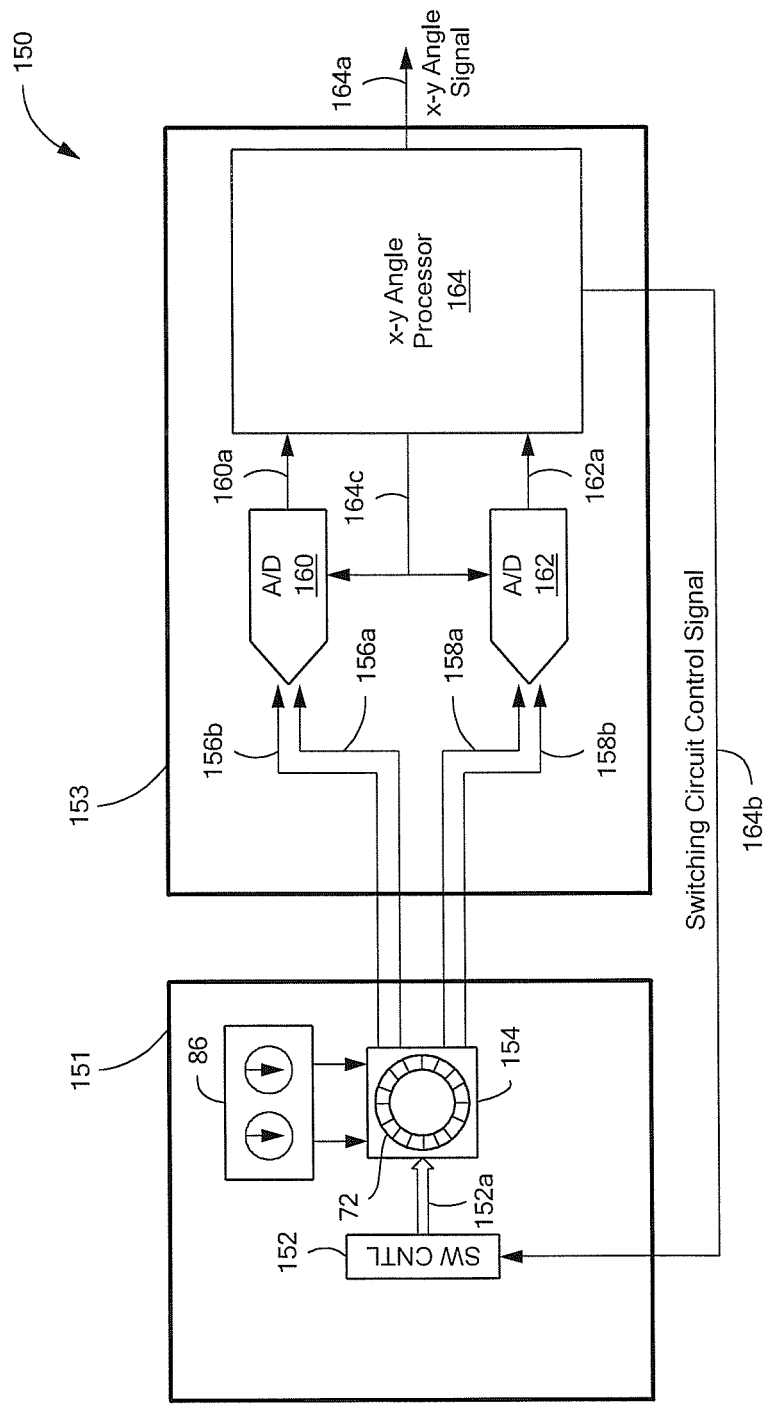
FIG. 4 is a block diagram showing another electronic circuit using a CVH sensing element to determine a direction of a sensed magnetic field, the electronic circuit including two analog-to-digital converters and an x-y angle processor.

Referring now to FIG. 4, in which like elements of FIG. 3 are shown having like reference designations, a magnetic field sensor 150 includes a sensing portion 151. The sensing portion 151 can include the CVH sensing element 72 and the current sources 86.

As with the magnetic field sensor 70 of FIG. 3, a magnet (not shown) can be disposed proximate to the CVH sensing (not shown) element 72, and can be coupled to a target object (not shown).

A switching circuit 154 can provide a CVH differential output signal 156a, 156b from a selected one of the vertical Hall elements within the CVH sensing element 72. However, the switching circuit 154 can also provide differential signals 156a, 156b between a selected two of the vertical Hall elements within the CVH sensing element 72. The selections can move among the vertical Hall elements.

The switching circuit 154 can also provide another sequential CVH differential output signal 158a, 158b from another selected one of the vertical Hall elements within the CVH sensing element 72. However, the switching circuit 154 can also provide differential signals 158a, 158b between a selected two of the vertical Hall elements within the CVH sensing element 72. The selections can move among the vertical Hall elements.

As will become apparent from discussion below, unlike the differential signal 72a, 72b generated by the CVH sensing element 72 in FIG. 3, the two CVH differential output signals 156a, 156b, and 158a, 158b do not necessarily sequence through all of the vertical Hall elements within the CVH sensing element 72. For example, each one of the CVH differential output signals 156a, 156b, and 158a, 158b can dwell upon one (or a differential two) respective vertical Hall elements, and can change the vertical Hall element(s) upon which they dwell from time to time.

Chopping, and as may be provided by the switching circuit 76 of FIG. 3, is not shown for the magnetic field sensor 150. Buy techniques described below, for example, in conjunction with FIG. 7A, it will become apparent that offset voltages of the vertical Hall elements can be reduced by means other than the chopping. However in some embodiments, chopping is also provided with the magnetic field sensor 150.

The sensing portion 151 includes current sources 86. The sensing portion 151 can also include a switching control circuit 152, configured to provide a switching control signal 152a to control the switching circuit 154, and therefore, to control the vertical Hall elements upon which the magnetic field sensor 150 dwells.

The magnetic field sensor 150 also includes an x-y direction component circuit 153. The x-y direction component circuit 153 is coupled to receive the two differential signals 156a, 156b, and 158a, 158b and is configured to generate a switching circuit control signal 164b, which essentially controls the t vertical Hall elements within the CVH sensing element 72 upon which the magnetic field sensor 150 dwells.

The x-y direction component circuit 153 can include a first analog-to-digital converter 160 coupled to receive the CVH differential output signal 156a, 156b and a second analog-to-digital converter 162 coupled to receive the other CVH differential output signal 158a, 158b. The two analog-to-digital converters 160, 162 are configured to generate respective digital signals 160a, 162a.

An x-y angle processor 164 is coupled to receive the two digital signals 160a, 162a and configured to generate an x-y angle signal 164a. The x-y angle processor 164 is also configured to generate the switching circuit control signal 164b. The x-y angle processor 164 is also configured to generate a control signal 164c to control which one of the analog-to-digital converters 160, 162 is converting at any particular time.

It will become apparent from discussion below that the x-y angle processor 164 can control which vertical Hall elements within the CVH sensing element 72 are being processed. For any given direction of magnetic field it will be understood that some, for example, one, of the vertical Hall elements within the CVH sensing element 72 generates a largest positive output signal, and others, for example, one other, of the vertical Hall elements within the CVH sensing element 72 generates a largest negative output signal. It will also be understood that for the given direction of the magnetic field some others, for example, one other of the vertical Hall elements within the CVH sensing element 72 generate an output signal that is near zero. Which ones of the vertical Hall elements in the CVH sensing element 72 achieve the above signal levels depends upon an angle of the magnetic field relative to the CVH sensing element 72. Also, it will become apparent from discussing below that, since the signals 160a, 160b are digital signals having a particular resolution, in the digital domain, there can be more than one vertical Hall element that generates the largest positive signal, more than one that generates the largest negative signal, and more than one that generates the zero signal.

Figure 5:
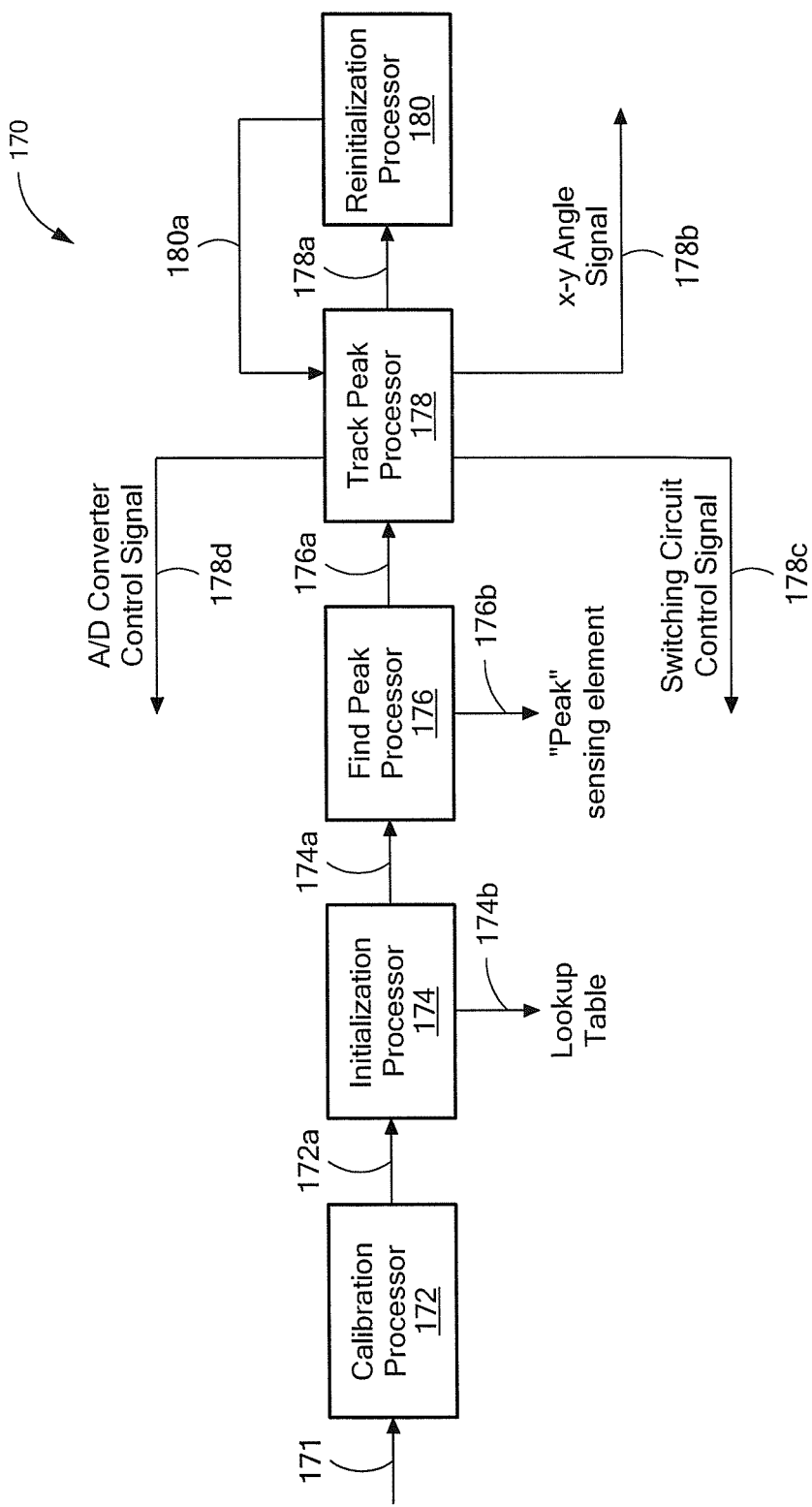
FIG. 5 is a block diagram showing a plurality of processors that can be within the x-y angle processor of FIG. 4, including a calibration processor, an initialization processor, a find peak processor, a track peak processor, and a reinitialization processor.

Referring now to FIG. 5, processors 170 can be included within the x-y angle processor 164 of FIG. 4. The processors 170 can include a calibration processor 172 coupled to receive an input signal, which can be the same as or similar to the signals 160a, 162a of FIG. 4. The calibration processor 172 is configured to generate one or more calibrated signals 172a. Functions of the calibration processor 172 are described more fully below in conjunction with FIG. 7A.

The processors 170 can also include an initialization processor 174 coupled to receive the calibrated signals 172a and configured to generate one or more initialized signals 174a. Functions of the initialization processor 174 are described more fully below in conjunction with FIGS. 7B and 7C.

However, let it suffice here to say that the initialization processor 174 is coupled to receive a plurality of magnetic field sensing element signals generated by a corresponding plurality of magnetic field sensing elements, for example, by a plurality of vertical Hall elements within the CVH sensing element 72 of FIG. 4. The initialization processor is configured to generate a table of values 174b, each value related to a respective difference between an identified respective value along a sinusoid and a ninety-degree value along the sinusoid taken ninety degrees apart from the identified respective value, wherein one of the identified respective values is at a peak of the sinusoid and other identified respective values are at selected phase increments along the sinusoid. The sinusoid is described more fully below in conjunction with FIG. 9.

The processors 170 can also include a find peak processor 176 coupled to receive the initialized signals 174a. Functions of the find peak processor 176 are described more fully below in conjunction with FIGS. 10 and 10A.

However, let it suffice here to say that the find peak processor 176 configured to identify a magnetic field sensing element (a "peak" magnetic field sensing element) from among the plurality of magnetic field sensing elements, for example, within the CVH sensing element 72 of FIG. 4 that generates a largest (peak amplitude) one of a plurality of magnetic field sensing element signals generated by the CVH sensing element 72 as a peak magnetic field sensing element signal when the CVH sensing element 72 is exposed to a magnetic field. The find peak processor is configured to generate a signal 176b that identifies the peak magnetic field sensing element.

The processors 170 can also include a track peak processor 178 coupled to receive information 176b pertaining to the peak magnetic field sensing element and also coupled to receive the lookup table 174b. Functions of the track the processor 178 are described more fully below in conjunction with FIG. 11.

However, let it suffice here to say, that the track peak processor 178 is configured to identify a ninety degree magnetic field sensing element from among the plurality of magnetic field sensing elements that has a primary response axis about ninety degrees rotated from the from a direction of a primary response axis of the peak magnetic field sensing element, the ninety degree magnetic field sensing element generating a ninety degree magnetic field sensing element signal. The track peak processor can also be configured to compute a difference between the peak magnetic field sensing element signal and the ninety degree magnetic field sensing element signal, and to compare the computed difference with the table of values to identify the direction of the magnetic field. The track peak processor is configured to generate an x-y angle signal 178*b*, which is the same as or similar to the x-y angle signal 164*a* of FIG. 4.

Furthermore, in some embodiments, the track peak processor is configured to identify a second different magnetic sensing element among the plurality of magnetic field sensing elements and proximate to the identified peak magnetic field sensing element as a next peak magnetic field sensing element that is expected to generate a new largest magnetic field sensing element signal when the directional magnetic field rotates to the second different direction. The track peak processor is coupled to receive the first and second converted signals 160*a*, 162*a* of FIG. 4 and is further configured to calculate whether the direction of the magnetic field is closer to the first direction or to the second direction.

The processors 170 can also include reinitialization processor 180. The reinitialization processor 180 is coupled to receive a signal 178*a* from the track peak processor 178 and configured to generate a recalibration signal 180*a*. Functions of the recalibration processor are described more fully below in conjunction with FIGS. 11 and 12.

It should be appreciated that FIGS. 6-12 show flowcharts corresponding to the below contemplated technique which would be implemented in computer system 164 (FIG. 4). Rectangular elements (typified by element 222 in FIG. 6), herein denoted "processing blocks," represent computer software instructions or groups of instructions. Diamond shaped elements, herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Figure 6:
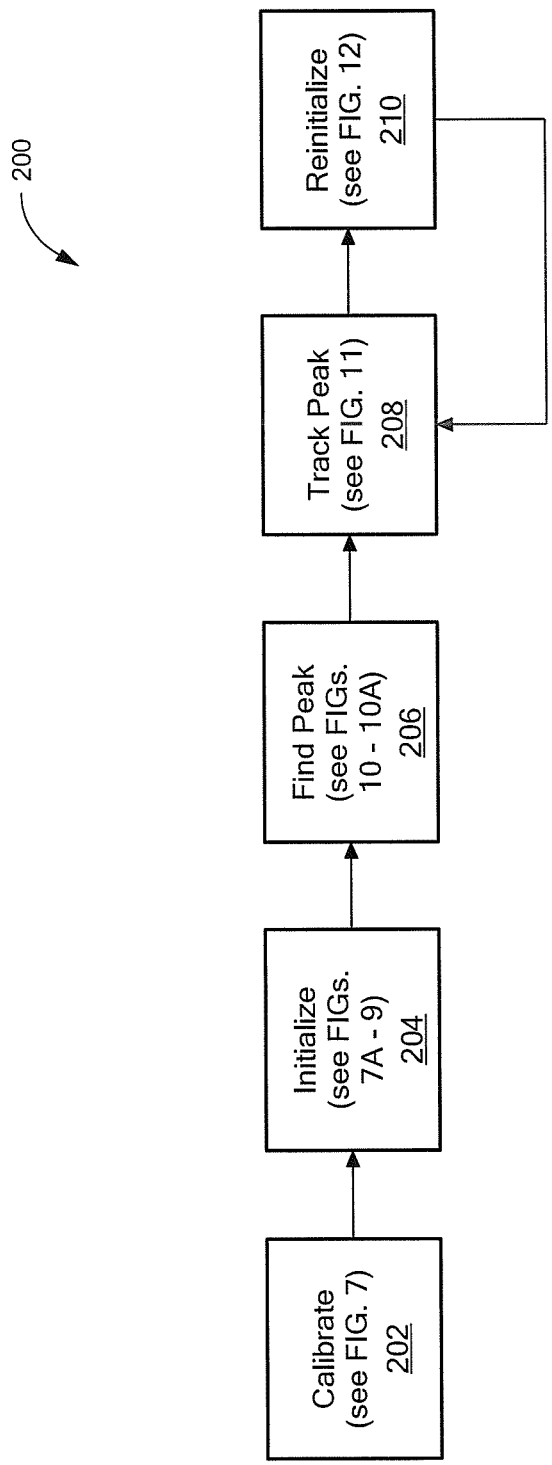
FIG. 6 is a flowchart showing a plurality of processing modules associated with the plurality of processors of FIG. 5, including a calibrate module, and initialize module, a find peak module, a track peak module, and a reinitialize module.

Referring now to FIG. 6, a process 200 can include a plurality of modules 202-210. The modules 202-210 can be computer implemented modules embodied in a non-transitory computer medium, for example, a computer readable memory. The modules 202-210 map directly to the processors 172-180 shown above in conjunction with FIG. 5. Thus, the process 200 in not described in detail here. Reference is made in each one of the module blocks 202-210 to subsequent figures where the process of each module is described in greater detail.

Simply stated, the process begins with a calibration at block 202, where gains of signals generated by a plurality of magnetic field sensing elements are calibrated.

At block 204, an initialization occurs, wherein a particular look up table (FIG. 7A) is generated and wherein offsets of the plurality of magnetic field sensing element signals are recorded.

At block 206, one of the magnetic field sensing elements (a "peak" magnetic field sensing element) having a largest magnetic field sensing element signal is identified and processed to find a so-called "peak" amplitude.

At block 208, the magnetic field sensing element having the peak amplitude is tracked. The magnetic field sensing element having the peak amplitude can change to other magnetic field sensing elements as a magnetic field being sensed rotates. The magnetic field sensing element having the peak amplitude is processed to identify a pointing direction of a magnetic field.

It should be understood that, because only one (or two) magnetic field sensing elements need to be processed and tracked, the process 200, and the associated magnetic field sensor 150 of FIG. 4 can resolve a pointing direction of a magnetic field much faster than the magnetic field sensor 70 of FIG. 3, which must process each one of a plurality of magnetic field sensing elements in order to identify a direction of the magnetic field.

At block 210, the initialization process of block 234 can be repeated.

Figure 7:
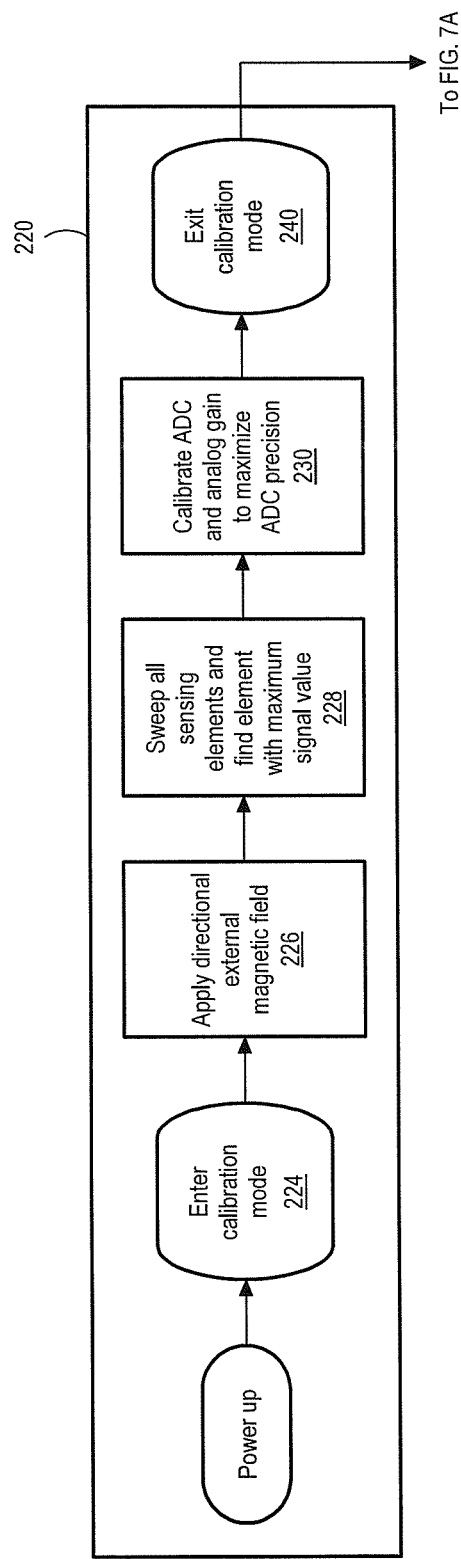
FIG. 7 is a flowchart showing a process that can represent the calibrate module of FIG. 6.

Referring now to FIG. 7, a process 220 corresponds to the calibrate module 202 of FIG. 6. Upon power up the method enters calibration mode at block 224. The calibration process 220 can be performed during manufacture. However, the calibration process 220 can also be performed in the field when the magnetic field sensor 150 of FIG. 4 is installed in an application.

At block 226, an external directional magnetic field is applied to the magnetic field sensor, for example, the magnetic field sensor 150 of FIG. 4. The applied magnetic field has a stationary direction along a sensitivity axis of the CVH sensing element 72 of FIG. 4. In other words, the magnetic field has a direction component in the plane of the page of FIG. 4.

At block 228, the magnetic field sensing elements are "swept." In other words, magnetic field sensing element signals from each one of the plurality of magnetic field sensing elements (vertical Hall elements) within the CVH sensing element 72 are collected or sampled. Also at block 228, a magnetic field sensing element from among the plurality of magnetic field sensing elements is identified that generates a largest positive signal value. It will be understood that the identified magnetic field sensing element is approximately aligned with the applied magnetic field.

At block 230 gains of the analog-to-digital converters 160, 162 of FIG. 4 can be calibrated based upon the largest signal value identified at block 228. The calibration can be performed in the digital domain within the x-y angle processor 164 of FIG. 4. However, in other embodiments, the calibration can be achieved with analog amplifiers (not shown) before or after the analog-to-digital converters 160, 162 of FIG. 4.

At block 240, the process 220 exits the calibration mode.

The initialization module 204 of FIG. 6 is represented by processes 250, 280 of FIGS. 7A and 7B below.

Figure 7A:
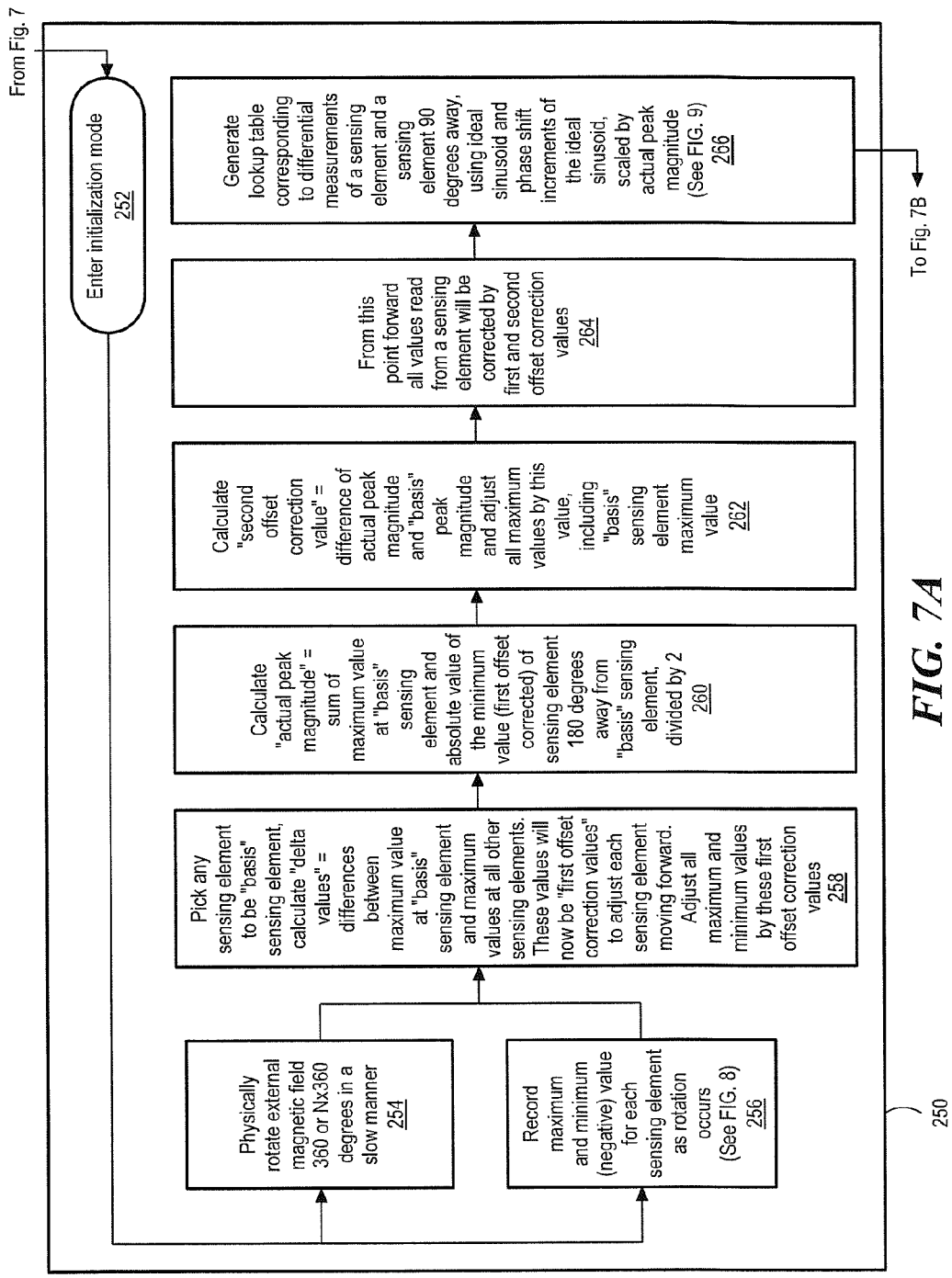
FIGS. 7A and 7B are flowcharts showing a process that can represent the initialization module of FIG. 6.

Referring now to FIG. 7A, the process 250 enters an initialization mode at block 252. At block 254, the external magnetic field, for example, the external magnetic field applied at block 226 of FIG. 7, can be applied again and physically rotated through at least three hundred sixty degrees, for example, N times three hundred sixty degrees.

At block 256, in parallel with a physical rotation of the magnetic field at block 254, maximum values, i.e., maximum positive values, and minimum values, i.e., maximum negative values are recorded for each one of the plurality of magnetic field sensing elements within the CVH sensing element 72 of FIG. 4. The process step of block 256 is described more fully below in conjunction with FIG. 8.

At block 258, first, any one of the plurality of magnetic field sensing elements is selected to be a "basis" magnetic field sensing element. Then, "delta values" are computed for each one of the plurality of magnetic field sensing elements. The delta values are computed by taking differences between the maximum value recorded for the basis magnetic field sensing element and the maximum values recorded for all of the other ones of the plurality of magnetic field sensing elements. The delta values will be understood to be "first offset correction values," and can be used to adjust the DC offset of each one of the plurality of magnetic field sensing elements as measurements are taken with the plurality of magnetic field sensing elements. Also at block 258, the maximum and minimum values recorded at block 256 can be adjusted by the respective ones of the first offset correction values.

At block 260, an "actual peak magnitude" is computed. The actual peak magnitude is computed by first taking a sum of the maximum value achieved by the basis magnetic field sensing element plus an absolute value of a minimum value (first corrected by a corresponding one of the first offset correction values) achieved by a magnetic field sensing element one hundred eighty degrees around the CVH sensing element 72 from the basis magnetic field sensing element, and then dividing by two. The actual peak magnitude corresponds to a zero to peak magnitude.

At block 262, a "second offset correction value" is computed. The second offset correction value is computed by taking a difference between the actual peak magnitude computed at block 260 and the peak magnitude of the basis magnetic field sensing element.

At block 264, it is indicated that from this point forward all values read from each one of the plurality of magnetic field sensing elements within the CVH sensing element 72 of FIG. 4 will be corrected by both the first offset correction values and by the second offset correction value.

At block 266, a lookup table is generated. The lookup table has a first value corresponding to a differential value generated by a difference between a magnetic field sensing element signal and a magnetic field sensing element signal that is ninety degrees around the CVH sensing element 72 of FIG. 4. The lookup table is generated not by using actual measurements from the CVH sensing element 72, but instead by using ideal sinusoids. The first lookup table value is generated for a zero degree phase of the ideal sinusoid and other lookup table values are generated for other phases of the ideal sinusoid. The other phases of the ideal sinusoid can be at selected phase increments. For example, in one embodiment the selected phase increments are about 0.352 degrees (1/1024 times 360 degrees). The process step of block 266 is described more fully below in conjunction with FIG. 9. Let it suffice here to say that the differential values within the lookup table can be used to identify a rotational direction of a magnetic field experienced by the CVH sensing element 72. The method of identification is described more fully below in conjunction with FIGS. 10, 10A, and 11.

Also at block 266, the values in the lookup table generated in accordance with the ideal sinusoid's can be scaled by the actual peak magnitude generated at block 260. In this way values in the lookup table of block 266 can be compared with actual measurements taken below.

Figure 7B:
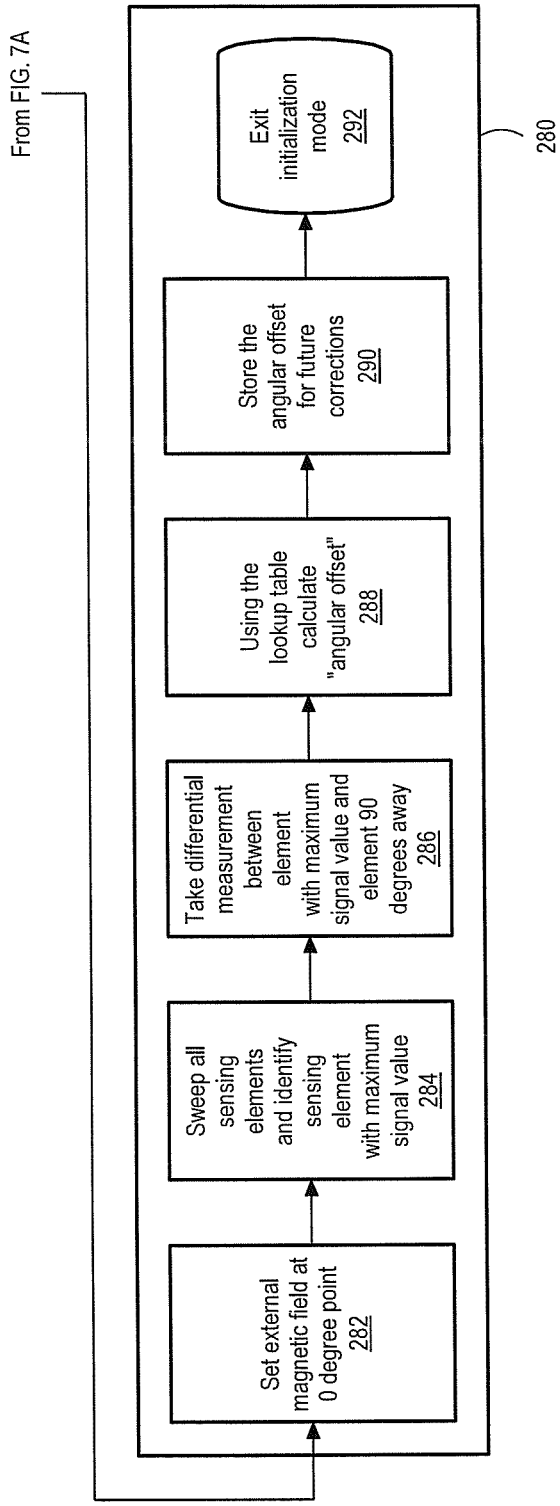

The initialization process of FIG. 7A continues to FIG. 7B.

Referring now to FIG. 7B, the continued process 280 begins at block 282 where the external magnetic field used for calibration and initialization is set to point toward a zero degree reference direction. The zero degree reference direction can be arbitrarily selected.

At block 284, magnetic field sensing element signals from all of the magnetic field sensing elements within the CVH sensing element 72 are swept, i.e., magnetic field sensing element signals from each one of the plurality of magnetic field sensing elements within the CVH sensing element 72 are collected or sampled. All of the sampled magnetic field sensing elements can be corrected by the first and second offset correction values generated in blocks 258 and 262 of FIG. 7A. Also at block 284, a magnetic field sensing element that has generated a largest maximum positive signal value is identified. It will be appreciated that this particular identified magnetic field sensing element is not necessarily perfectly aligned with the magnetic field set to zero degrees at block 282.

At block 286, an actual differential measurement is taken. The actual differential measurement is a difference between the largest magnetic field sensing element signal value of the magnetic field sensing element identified at block 284 and a magnetic field sensing element signal value generated by a magnetic field sensing element ninety degrees around the CVH sensing element from the identified magnetic field sensing element.

It should be appreciated that differential measurements taken here and below can be taken by coupling inputs of one of the two analog-to-digital converters 160, 162 of FIG. 4 to two different magnetic field sensing elements. Still, the first offset correction values generated in block 258 of FIG. 7A and the second offset correction value generated at block 262 of FIG. 7A can be applied to the differential measurement.

At block 288, the actual differential measurement taken at block 286 is compared with values in the lookup table generated in block 266 of FIG. 7A. It will be understood that the actual differential measurement may correspond to the first differential value of the lookup table, which is associated with the ideal sinusoid at zero degree phase. However, the actual differential measurement may instead correspond to one of the other differential values of the lookup table, which are associated with other phases of the ideal sinusoid. Because the magnetic field applied at block 282 may not be perfectly aligned with the identified magnetic field sensing element that has the largest magnetic field sensing element signal value, the actual differential measurement may be closest to any one of the values in the lookup table. Since each value in the lookup table is representative of a phase of an ideal sinusoid, i.e., an angle, the value in the lookup table with which the actual differential measurement taken at block 286 best matches is representative of an angular offset of measurements taken by the CVH sensing element 72 from the zero degree reference angle to which the magnetic field is set at block 282.

At block 290, the angular offset is stored and can be used to angularly correct any subsequent angular measurements associated with a CVH sensing element 72.

At block 292 the process 280 exits the initialization mode.

Figure 8:
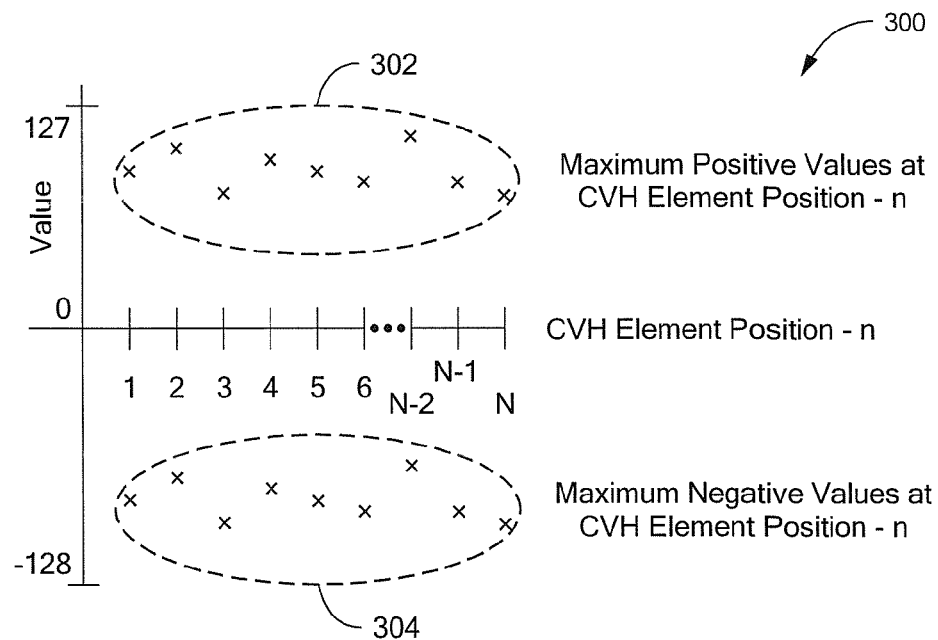
FIG. 8 is a graph showing some details of the process of FIG. 7A.

Referring now to FIG. 8, a graph 300 has a horizontal axis with a scale in units of n, where n is an index number of vertical Hall elements within the CVH sensing element 72 of FIG. 4. There are N vertical Hall elements within the CVH sensing element 72. The graph 300 also has a vertical axis with exemplary units of amplitude in a ±eight bit digital scale.

Data points 302 correspond to maximum positive signal values achieved by each one of the vertical Hall elements within the CVH sensing element 72 at block 256 of FIG. 7A as the external magnetic field is rotated at block 254 of FIG. 7A through at least three hundred and sixty degrees. Similarly, data points 304 correspond to a minimum negative signal values achieved by each one of the vertical Hall elements within the CVH sensing element 72 as the external magnetic field is rotated.

Figure 9:
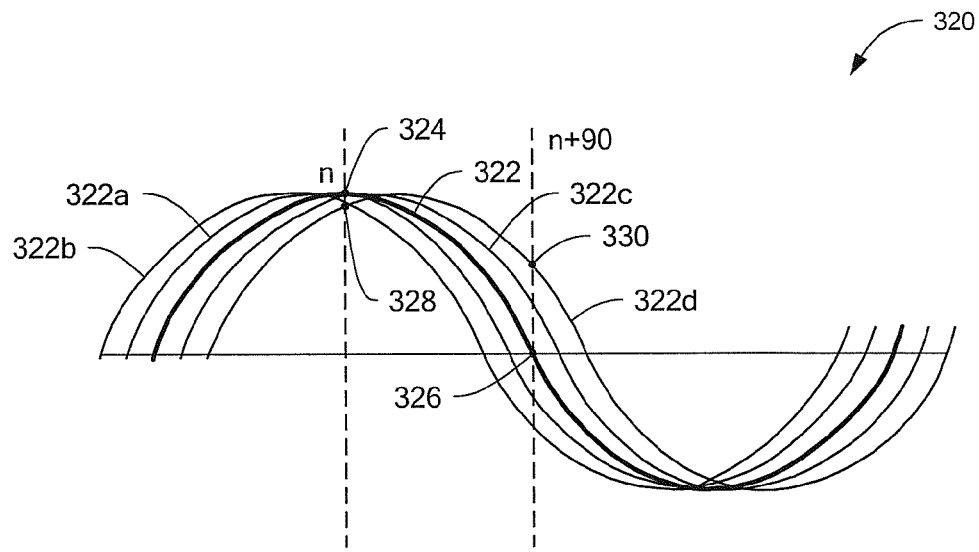
FIG. 9 is a graph showing an additional details of the process of FIG. 7A.

Referring now to FIG. 9, a graph 320 has a horizontal axis with a scale in arbitrary units of phase. The graph 320 also has a vertical scale in arbitrary units of amplitude. The graph 320 can be used to clarify the process step 266 of FIG. 7A, where a lookup table is generated.

An ideal sinusoid 322 is shown at a particular phase representative of a zero degree phase. Ideal sinusoid 322a, 322b are shown in predetermined phase increments in one direction apart from the ideal sinusoid 322. Ideal sinusoids 322c, 322d are shown in predetermined phase increments in the other direction apart from the ideal sinusoid 322.

A point 324 on the ideal sinusoid 322 is indicative of a magnitude of the ideal sinusoid 322 at a zero degree phase of the ideal sinusoid 322. A point 326 on the ideal sinusoid 322 is indicative of a magnitude of the ideal sinusoid 322 at a ninety degree phase of the ideal sinusoid 322. The first differential value described above in conjunction with block 266 of FIG. 7A and stored in the lookup table corresponds to a difference between the value of the ideal sinusoid 322 at the point 324 and the value of the ideal sinusoid 322 at the point 326.

A point 328 on the phase shifted ideal sinusoid 322d is indicative of a magnitude of the phase shifted ideal sinusoid 322d at a zero degree phase of the ideal sinusoid 322. A point 330 on the phase shifted ideal sinusoid 322d is indicative of a magnitude of the phase shifted ideal sinusoid 322d at a ninety degree phase of the ideal sinusoid 322. Another differential value described above in conjunction with block 266 of FIG. 7A and stored in the lookup table corresponds to a difference between the value of the phase shifted ideal sinusoid 322d at the point 328 and the value of the phase shifted ideal sinusoid 322d at the point 330.

It will be understood that the differential value associated with phase shifted ideal sinusoid 322d is different than the differential value associated with the zero degree ideal sinusoid 322. Furthermore, it will be understood that the differential value can be used to identify a phase of the sinusoid, for example, which one of the sinusoids 322, 322a, 322b, 322c, 322d is associated with a particular differential value.

Differential values stored in the lookup table generated at block 266 of FIG. 7A can be used to identify a phase of an actual measured signal generated by the plurality of vertical Hall elements within the CVH sensing element 72 of FIG. 4. Such use of the lookup table is described more fully below in conjunction with FIGS. 10, 10A, and 11.

Figure 10:
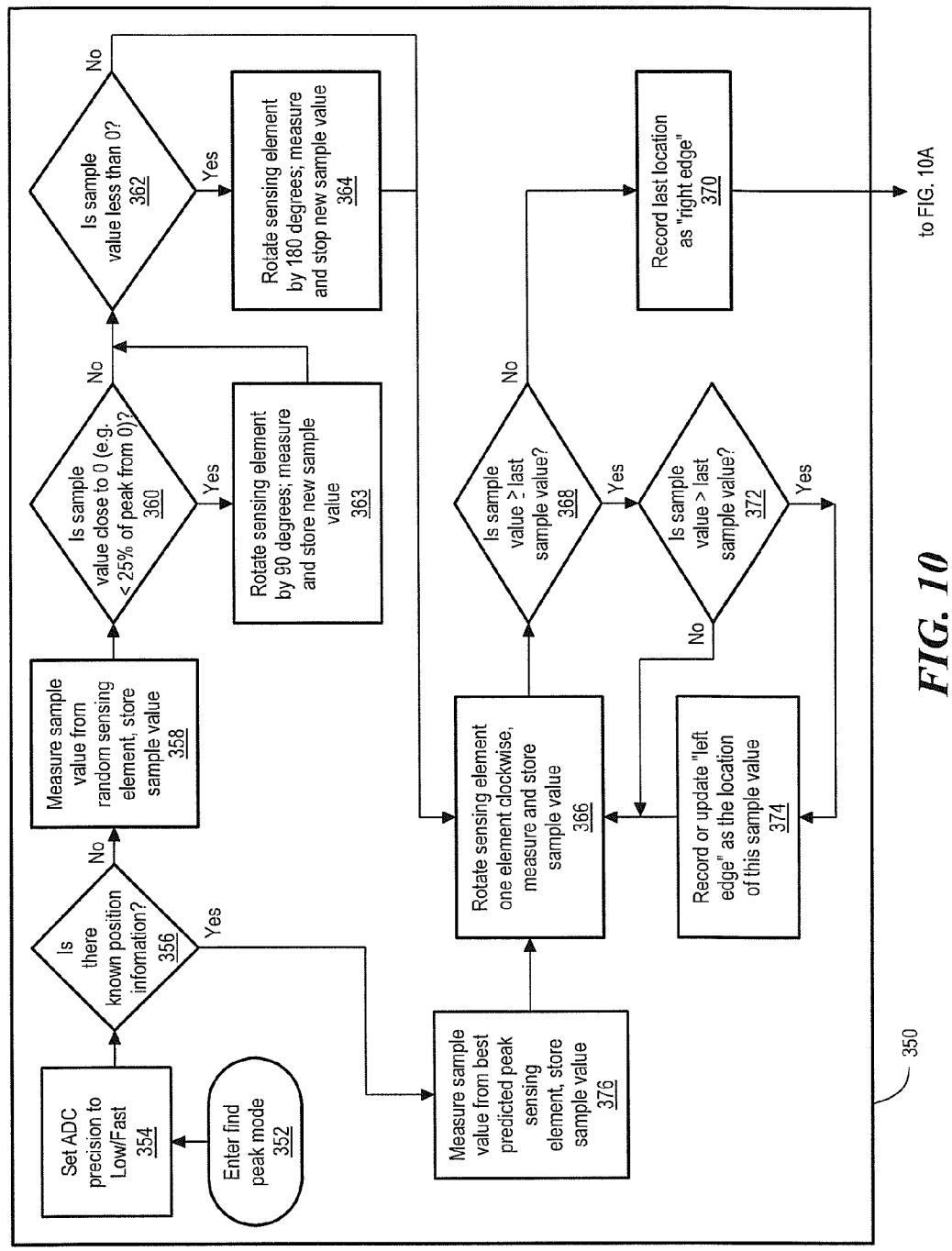
FIGS. 10 and 10A are flow chart showing a process that can represent the find peak module of FIG. 6.

Referring now to FIG. 10, a process 350 begins at block 352 where a "find peak" mode is entered. The find peak mode corresponds to the find peak module 206 of FIG. 6.

It will be understood that for the given direction of magnetic field experienced by the CVH sensing element 72 of FIG. 4, a small number (range) of the vertical Hall elements within the CVH sensing element will have a largest signal value. The small range of vertical Hall elements correspond to those vertical Hall elements that are somewhat aligned with the sensed magnetic field. However none of the vertical Hall elements may align perfectly with the sensed magnetic field.

Thus, the process 350 attempts to identify with a high degree of granularity at what angle the magnetic field is pointing even though it may be pointing between two of the vertical Hall elements, and even though a small range of magnetic field sensing elements within the CVH sensing element 72 of FIG. 4 may generate the same magnitude of output signal for a given direction of a sensed magnetic field.

At block 354, by way of the control signal 164c of FIG. 4, the x-y angle processor 164 of FIG. 4 can set precisions of the analog to digital converters 160, 162 to a low precision indicative of high-speed operation of the analog-to-digital converters 160, 162.

At block 356, it is identified if there is known rotational position information of a sensed magnetic field already available. If there is no rotational position information already available then the process proceeds to block 358.

At block 358, a measured sample value is measured from a random one of the vertical Hall elements of the CVH sensing element 72 of FIG. 4 and the measured sample value is stored. As described above in conjunction with block 264 of FIG. 7A, this and all subsequent measured sample values from the CVH sensing element 72 can first be corrected by the first offset correction values identified at block 258 of FIG. 7A and by the second offset correction value identified at block 262 of FIG. 7A. The corrections are not necessarily explicitly mentioned below.

It will be appreciated that the measured sample value can be any value, because a randomly selected magnetic field sensing element can be at any alignment in relation to the sensed magnetic field, including a zero degree alignment, a ninety degree alignment, a one hundred eighty degree alignment, or any other alignment. Thus, the measured sample value can be zero, a positive value, or a negative value.

At block 360, it is identified if the measured sample value is close to a zero degree value. In other words, it is identified if the measured sample value is large and close to the actual peak magnitude value (positive) identified at block 260 of FIG. 7A. In some embodiments, the measured sample value is considered to be close to the zero degree value if the measured sample value (after corrections) is within about twenty-five percent of the actual peak value. However, other percentages can also be used.

At block 360, if the measured sample value is not close to the actual peak value, the process proceeds to block 362. If the measured sample value is close to the actual peak value, the process proceeds to block 363.

At block 363, another vertical Hall element within the CVH sensing element 72 is selected that is ninety degrees around the CVH sensing element from the vertical Hall element randomly selected at block 358. It will be understood that selection of this vertical Hall element that is ninety degrees around the CVH sensing element can result in the magnetic field sensing element that is generating a signal closer to the actual peak signal. The process then proceeds to block 362.

At block 360, if the measured sample value is close to the actual peak value, the process proceeds to block 362.

At block 362, if the sample value generated by the selected magnetic field sensing element is less than zero, then the process proceeds to block 364. At block 364, another vertical Hall element within the CVH sensing element 72 is selected that is one hundred eighty degrees around the CVH sensing element from the vertical Hall element previously selected. The process then proceeds to block 366.

At block 362, if the sample value generated by the selected magnetic field sensing element is not less than zero, then the process proceeds to block 366.

At this point it should be recognized that the selected magnetic field sensing element within the CVH sensing element 72 should be that magnetic field sensing element that is generating a magnetic field sensing element signal value that is the actual peak value identified in block 260 of FIG. 7A. Subsequent steps take iterative steps around the presently selected magnetic field sensing element to identify other magnetic field sensing elements that generate a same largest magnetic field sensing element signal value.

At block 366, from the presently selected magnetic field sensing element, a rotation is made by one magnetic field sensing element, for example, in a clockwise direction, from the presently selected magnetic field sensing element. From that newly selected magnetic field sensing element a magnetic field sensing element signal value (a sample value) is taken and stored.

At block 368, it is determined if the sample value taken at block 366 is greater than or equal to the sample value taken at block 364. If the sample value taken at block 366 is greater than or equal to the sample value taken at block 364, then the process proceeds to block 372.

At block 372 is determined if the sample value taken at block 366 is greater than the sample value taken at block 364. At block 372, if the sample value taken at block 366 is greater than the sample value taken at block 364, then the process proceeds to block 374.

At block 374, a location, i.e., a position, of the magnetic field sensing element from which the sample value is taken at block 366 is recorded as a so-called "left edge. The process then returns to block 366. The identified magnetic field sensing element is at one edge of a small range of magnetic field sensing elements within the CVH sensing element 72 that will generate the same magnitude of sample value. The number of magnetic field sensing elements that will generate the same magnitude sample value is related to the number of digital bits (i.e., granularity) that are used to represent the sample values.

At block 372, if the sample value taken at block 366 is not greater than the sample value taken at block 364, then the process returns to block 366.

By looping around the blocks 366, 368, 372, 374, eventually a position of a last magnetic field sensing element in the clockwise direction that produces a largest sample value is identified as the right edge, and the process proceeds to block 370.

At block 370, the right edge magnetic field sensing element position and sample value are recorded.

Figure 10A:
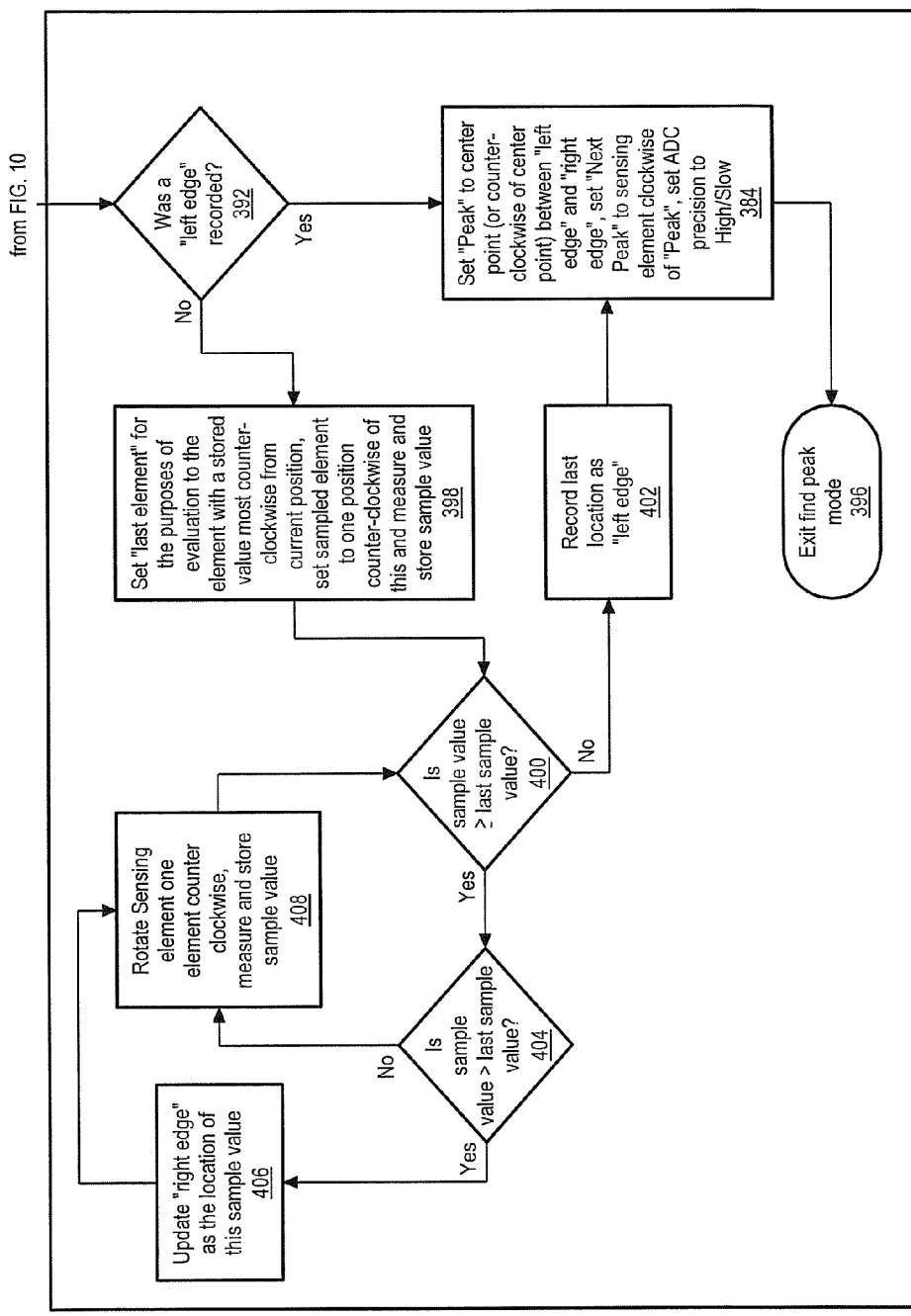

Referring now to FIG. 10A, the process 350 of FIG. 10 continues with the process 390, at block 392.

At block 392, it is identified if a so-called "left edge" has already been identified. The left edge will be understood to be a position of a last magnetic field sensing element in a counterclockwise direction that produces the largest sample value.

At block 392, if the left edge has not already been identified, the process proceeds to block 398

At block 398, a so-called "last element" is identified to be one of the magnetic field sensing elements identified in the loop of blocks 366, 368, 372, 374, some sequential ones of which should have generated the largest sample value. The last element is identified to be the magnetic field sensing element in a counterclockwise direction from the right edge and that generated the largest sample value. At block 398, a position of a magnetic field sensing element for next processing is identified to be the magnetic field sensing element one element counterclockwise from the last element. At block 398 the sample value from this magnetic field sensing element for next processing is measured and stored. The process then proceeds to block 400.

At block 400, if the simple value measured and stored at block 398 is greater than or equal to the sample value of the magnetic field sensing element immediately clockwise from the magnetic field sensing element from which the sample value was taken at block 398, then the process proceeds to block 404.

At block 404, if the sample value measured and stored at block 398 is greater than the sample value of the magnetic field sensing element immediately clockwise from the magnetic field sensing element from which the sample value was taken at block 398, then the process proceeds to block 406.

At block 404, if the sample value measured and stored at block 398 is not greater than the sample value of the magnetic field sensing element immediately clockwise from the magnetic field sensing element from which the sample value was taken at block 398, then the process proceeds to block 408.

At block 406, a location, i.e., a position, of the magnetic field sensing element from which the sample value is taken at block 366 is recorded as a so-called "right edge." The process then proceeds to block 408. The identified magnetic field sensing element is at another edge of the small range of magnetic field sensing elements within the CVH sensing element 72 that will generate the same magnitude of sample value.

At block 408, from the presently selected magnetic field sensing element, a rotation is made by one magnetic field sensing element, for example, in a counter clockwise direction, from the presently selected magnetic field sensing element. From that newly selected magnetic field sensing element a magnetic field sensing element signal value (a sample value) is taken and stored. The process then returns to block 400.

By looping around the blocks 400, 404, 406, 408, eventually a position of a last magnetic field sensing element in the counter clockwise direction that produces the largest sample value is identified as the left edge, and the process proceeds to block 402.

At block 402, the left edge magnetic field sensing element position and sample value are recorded.

At this point, the above-described small range of magnetic field sensing elements within the CVH sensing element 72 of FIG. 4 that generate the same magnitude of sample value is identified by the left and right edges. As described above, the number of magnetic field sensing elements that will generate the same magnitude sample value is related to the number of digital bits (i.e., granularity) that are used to represent the sample values. The number of magnetic field sensing elements that will generate the same magnitude sample value is also related to the number of magnetic field sensing elements (vertical Hall elements) within the CVH sensing element 72.

For example, in some embodiments, there are sixty-four vertical Hall elements in the CVH sensing element 72, each one of the sixty-four vertical Hall elements incremented by one vertical Hall element contact from an adjacent vertical Hall element. Continuing the example, in some embodiments the sample values of the magnetic field sensing elements have +/−eight bits, i.e., nine bits. For these embodiments, one or two adjacent magnetic field sensing elements within the CVH sensing element may generate the largest sample value. For another exemplary embodiment for which the sample values of the magnetic field sensing elements have +/−3 bits, i.e., 4 bits, seven or eight adjacent magnetic field sensing elements within the CVH sensing element may generate the largest sample value. The number is also determined in part by a direction of the sensed magnetic field relative to the positions of the magnetic field sensing elements.

It is desirable that the magnetic field sensor 150 of FIG. 4 be able to identify the pointing direction of the sensed magnetic field within the x-y angle signal 164a with an angular resolution finer than angular steps of the, for example, sixty-four, vertical Hall elements within the CVH sensing element 72. To this end, the small range of magnetic field sensing elements within the CVH sensing element 72 identified above that generate the same magnitude sample value can be used to interpolate within the small range.

At block 384, a so-called "peak" pointing direction is calculated to be at an angular position midway between the left edge and the right edge identified above. The peak will be understood to represent an angular direction of the sensed magnetic field sensed by the magnetic field sensor 150 of FIG. 4.

Where there are an odd number of magnetic field sensing elements between the right edge and the left edge, one of the magnetic field sensing elements between the left edge and the right edge is aligned with the rotational position of the peak. Where there is an even number of magnetic field sensing elements between the right edge and the left edge, there is not a magnetic field sensing element aligned exactly with the peak.

Where there are an odd number of magnetic field sensing elements between the right edge of the left edge, a center one of the magnetic field sensing elements between the right edge and the left edge is identified to be a so-called "peak" magnetic field sensing element. Where there is an even number of magnetic field sensing elements between the right edge and the left edge, a magnetic field sensing element one element, for example, clockwise, from the peak pointing direction identified at block 384 is identified to be the peak magnetic field sensing element.

Also at block 384, a so-called "next peak element" is identified to be the magnetic field sensing element one element, for example, clockwise, from the peak magnetic field sensing element.

Also at block 384, by way of the control signal 164c of FIG. 4, the x-y angle processor 164 of FIG. 4 can set precisions of the analog to digital converters 160, 162 to a high precision indicative of low-speed operation of the analog-to-digital converters 160, 162. This higher precision can be used for subsequent processing steps.

The above processes 350, 390 of FIGS. 10 and 10A, respectively, are used to identify the above-described "peak" magnetic field pointing direction, the above-described "peak" magnetic field sensing element and the above-described "next peak" magnetic field sensing element. It will be understood that all of the above are performed for one pointing direction of the sensed magnetic field. However, the sensed magnetic field may be rotating relative to the CVH sensing element 72 of FIG. 4. In fact, the magnetic field may be rotating quickly. Thus, processes described below can be used to "track" the magnetic field as it rotates.

Figure 11:
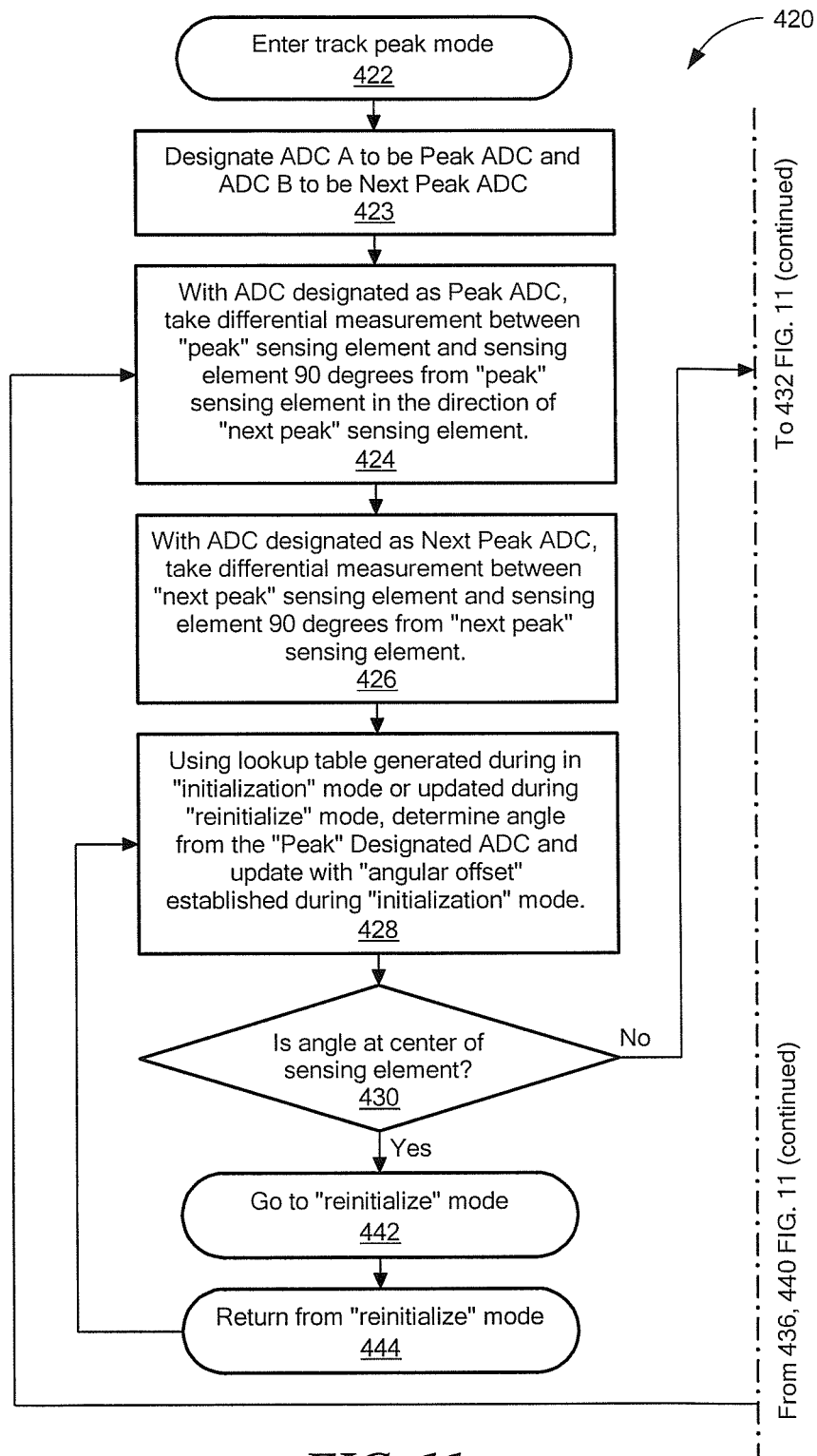
FIG. 11 is a flow chart showing a process that can represent the track peak module of FIG. 6.
Figure 11:
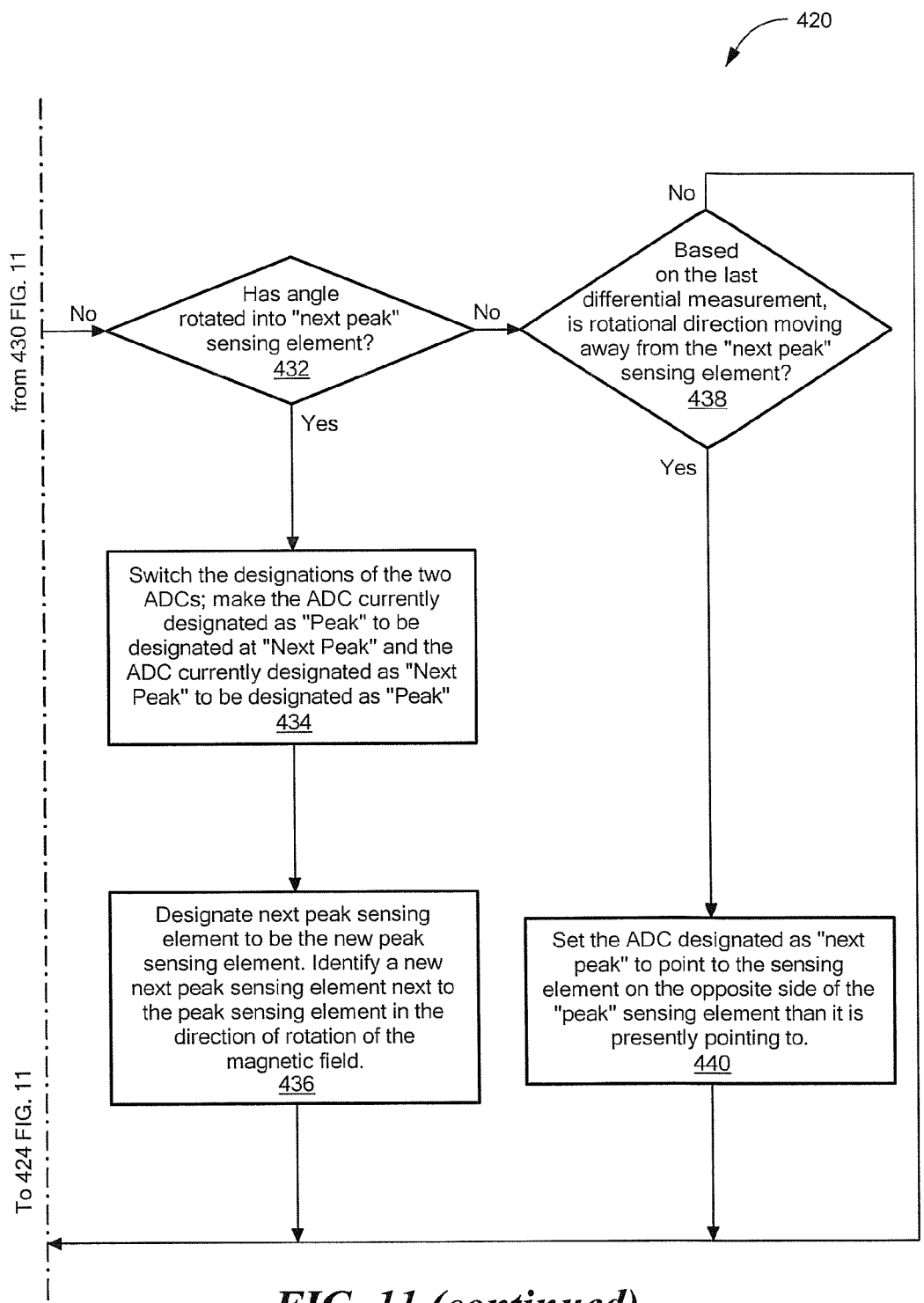

Referring now to FIG. 11, a process 420 begins at block 422 where a "track peak" mode is entered. The track peak mode corresponds to the track peak module 208 of FIG. 6.

At block 423, one of the analog-to-digital converters 160, 162 of FIG. 4 is designated to be a peak ADC and the other one of the analog-to-digital converters 160, 162 is designated to be the next peak ADC.

At block 424, the analog-to-digital converter designated as the peak analog-to-digital converter is used to take a first differential measurement. The first differential measurement is taken between the magnetic field sensing element identified as the peak magnetic field sensing element at block 384 of FIG. 10A and a magnetic field sensing element ninety degrees around the CVH sensing element 72 from the peak magnetic field sensing element. The ninety degrees is taken in a direction of the next peak magnetic field sensing element also identified at block 384. In the example given herein, this direction is clockwise.

At block 426, the analog-to-digital converter designated as the next peak analog-to-digital converter is used to take a second differential measurement. The second differential measurement is taken between the magnetic field sensing element identified at the next peak magnetic field sensing element at block 384 of FIG. 10A and a magnetic field sensing element ninety degrees around the CVH sensing element 72 from the next peak magnetic field sensing element. Again, the ninety degrees is taken in a direction above, e.g., in a clockwise direction.

It will be appreciated that the conversions performed in blocks 424, 426 can be performed in parallel. However, in other embodiments, the conversions can be performed in series.

At this point two differential measurements have taken, one for each of two adjacent magnetic field sensing elements within the CVH sensing element 72 of FIG. 4. One of these differential measurements is taken from a magnetic field sensing elements that is aligned or nearly aligned with the sensed magnetic field. The other one of the differential measurements is taken from a magnetic field sensing element that is anticipated to be a next magnetic field sensing element aligned with the sensed magnetic field when the magnetic field rotates. Thus, it will be appreciated that the conversion by the next peak ADC, which would otherwise take time, is already available when the magnetic field rotates. Thus, by using the second analog-to-digital converter, the magnetic field sensor 150 of FIG. 4 is able to track rotating magnetic fields that are rotating too fast to be tracked by one analog-to-digital converter.

It will be understood from discussion below the designations of peak ADC and next peak ADC can switch back and forth between the two analog-to-digital converters 160, 162 of FIG. 4. In this way, as the sensed magnetic field rotates, use of the analog-to-digital converter 160, 162 can essentially "ping pong" back-and-forth, with one of the analog-to-digital converters 160, 162 being used for calculations of magnetic field direction at some times and the other one of the analog-to-digital converters 160, 162 being used for calculations of the magnetic field direction at other times.

The process proceeds to block 428. At block 428, the differential measurement taken at block 424 is compared with the lookup table generated at block 266 of FIG. 7A. Referring briefly to FIG. 9, the differential measurement can be used to identify, with a high degree of resolution, a position, i.e., a phase, of the signal generated by the peak magnetic field sensing element. Thus, even though the peak magnetic field sensing element may not be exactly aligned with the sensed magnetic field, the lookup table of block 266 of FIG. 7A can be used to identify an angular offset between the position of the peak magnetic field sensing element and the rotational orientation of the sensed magnetic field. The granularity with which this can be established is related to the phase step size of the sinusoids of FIG. 9, and the related number of values in the lookup table. For example, in one particular embodiment the step size of the sinusoids associated with the lookup table is 0.352 degrees. However, the step size can be greater than or less than 0.352 degrees.

It will be appreciated that the differential measurements are more sensitive to the phase of the sinusoids of FIG. 9 than, for example, measurements of the peaks of the sinusoids, which change in value slowly with respective phase of the sinusoids.

Returning to FIG. 11, the comparison made at block 428 can be used to identify, with a high degree of resolution, the pointing direction of the sensed magnetic field. The measurement can also be corrected by using the angular offset stored at block 290 of FIG. 7B.

The process proceeds to block 430. At block 430, it is determined if the magnetic field sensing element used to take the differential measurement is aligned with the sensed magnetic field. This determination can be made merely by using the differential measurement. If the differential measurement corresponds for example, to the sinusoids 322 of FIG. 9, i.e., to a value in the lookup table associated with the sinusoids 322, then the magnetic field sensing element used to take the differential measurement is aligned with the sensed magnetic field.

At block 430, if the magnetic field sensing element used to take the differential measurement is aligned with the sensed magnetic field, then, optionally, the process can continue to block 442, entering a "reinitialize" mode. The reinitialize mode corresponds to the reinitialize module 230 of FIG. 6. The reinitialize mode is also discussed more fully below in conjunction with FIG. 12. Let it suffice here to say that during the reinitialize mode, the lookup table generated at block 266 of FIG. 7A can be updated.

At block 444 the process returns from the reinitialize mode and returns to block 428.

At block 430, if the magnetic field sensing element used to take the differential measurement is not aligned with the sensed magnetic field, the process proceeds to block 432.

At block 432, it is determined if the angle of the sensed magnetic field has rotated into or toward the next peak magnetic field sensing element identified at block 384 of FIG. 10A. This determination can also be made using the lookup table 266. For example, referring again briefly to FIG. 9, if the differential measurement being used corresponds to a sinusoid that is outside of the range of sinusoids of FIG. 9, then it is most likely that angle of the sensed magnetic field has rotated into the next peak magnetic field sensing element.

At block 432, if the angle of the sensed magnetic field has rotated into the next peak magnetic field sensing element and the process proceeds to block 434.

At block 434, designations of the two analog-to-digital converters, originally designated at block 424, 426, are reversed.

At block 436, magnetic field sensing elements are re-designated. The magnetic field sensing element previously designated to be the next peak magnetic field sensing element is now designated to be the peak sensing element. Also, a new next peak sensing element is identified to be adjacent to the newly designated peak sensing element in the direction of rotation of the sensed magnetic field. The process then returns to blocks 424, 426. Conversions can again be done in parallel.

At block 432, if the angle of the sensed magnetic field has not rotated into the next peak magnetic field sensing element and the process proceeds to block 438. Block 438 essentially identifies whether the direction of rotation of the magnetic field has changed to the other rotation.

At block 438, it can be identified by way of the differential measurements being used in comparison with the lookup table 266 of FIG. 7A, whether the rotational direction has changed to the other rotational direction. If the rotational direction has changed, the process proceeds to block 440. If the rotational direction of the magnetic field has not changed then the process returns to block 424 were conversions are again done.

At block 440, the magnetic field sensing element presently designated as the next peak magnetic field sensing element is changed. A new magnetic field sensing element is designated as the next peak magnetic field sensing element. The new magnetic field sensing element designated as the next peak magnetic field sensing element is selected to be the magnetic field sensing element that is on the opposite side rotationally from the peak magnetic field sensing element from the magnetic field sensing element presently designated as the next peak magnetic field sensing element. The process then returns to block 424.

It will be appreciated this process 420 can track the pointing direction of the sensed magnetic field. It will also be appreciated that, by using two analog-to-digital converters, at the time that the sensed magnetic field rotates from being aligned with one magnetic field sensing element to being aligned with another magnetic field sensing element, samples are already available from the other magnetic field sensing element. Thus, the process 42, used to track the direction of the sensed magnetic field, can be faster and can track faster rotating magnetic fields then a process that uses only one analog-to-digital converter.

Figure 12:
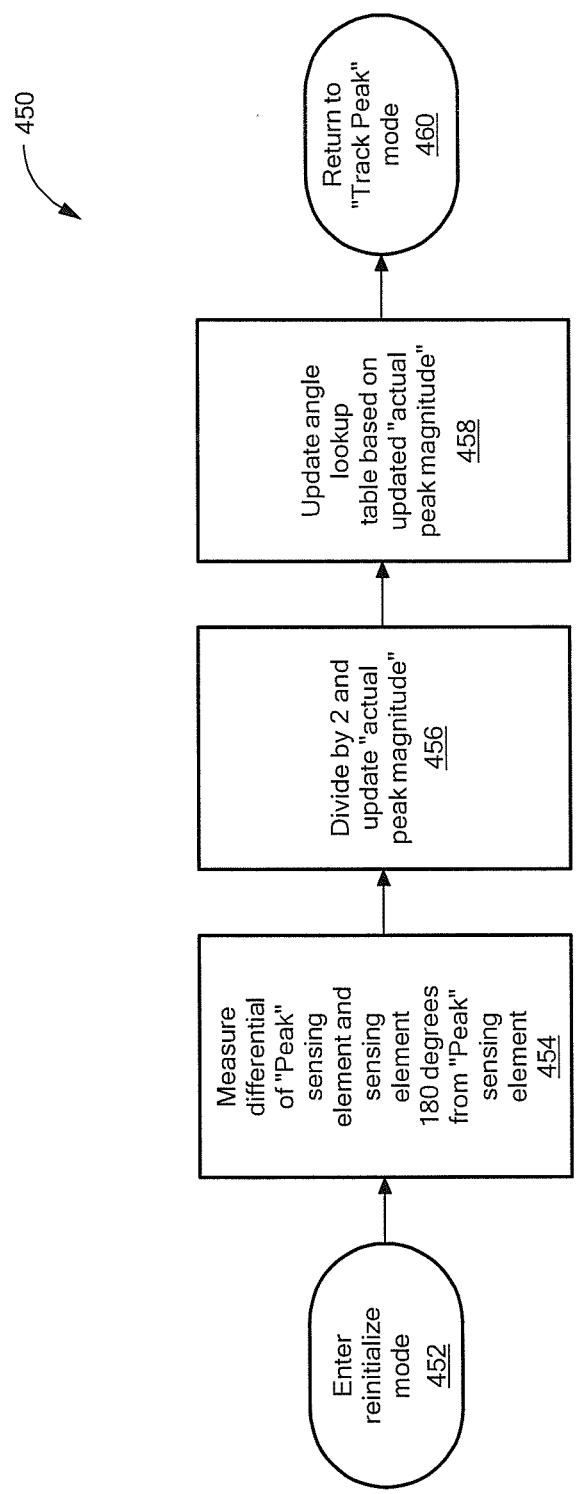
FIG. 12 is a flow chart showing a process that can represent the reinitialization module of FIG. 6.

Referring now to FIG. 12, a process 450 begins at block 450 where the reinitialize mode is entered. The reinitialize mode corresponds to the reinitialize module 210 of FIG. 6. The reinitialize mode is entered at block 442 of FIG. 11.

At block 454, since, according to block 430 of FIG. 11, the sensed magnetic field is aligned with or centered with the magnetic field sensing element currently designated as the peak magnetic field sensing element and from which measurements are taken and used, a new differential measurement can be taken by one of the two analog-to-digital converters 160, 162 of FIG. 4. This differential measurement can result in a new "actual peak magnitude" like that computed at block 260 of FIG. 7A. This differential measurement can be taken between the magnetic field sensing element designated as the peak magnetic field sensing element and a magnetic field sensing element one hundred eighty degrees around the CVH sensing element 72 from the peak magnetic field sensing element.

At block 456, the differential measurement taken at block 454 is divided by two, and the result is designated to be a new or updated "actual peak magnitude."

Using the new or updated actual peak magnitude, the lookup table originally generated at block 266 of FIG. 7A can be updated, i.e., re-scaled.

At block 460, the process returns to the track peak mode, and, in particular, to block 444 of FIG. 11.

Having described preferred embodiments of the invention it will now become apparent to those of ordinary skill in the art that other embodiments incorporating these concepts may be used. Additionally, the software included as part of the invention may be embodied in a computer program product that includes a computer-readable storage medium. For example, such a computer-readable storage medium can include a computer-readable memory device, such as a solid state memory, a hard drive device, a CD-ROM, a DVD-ROM, or a computer diskette, having computer-readable program code segments stored thereon. A computer-readable transmission medium can include a communications link, either optical, wired, or wireless, having program code segments carried thereon as digital or analog signals. Accordingly, it is submitted that that the invention should not be limited to the described embodiments but rather should be limited only by the spirit and scope of the appended claims.

All publications and references cited herein are expressly incorporated herein by reference in their entirety.

What is claimed is:

1. A method of determining a direction of a directional magnetic field, comprising:
   generating a table of difference values comprising a plurality of difference values, each difference value of the plurality of difference values computed as a respective difference between an identified respective sine value of a sinusoid, the sinusoid having a plurality of sine values, and a ninety-degree sine value of the sinusoid taken ninety degrees apart from the identified respective sine value, wherein one of the identified sine values is at a peak value of the sinusoid and other identified sine values are at selected phase increments of the sinusoid;
   receiving the directional magnetic field with a plurality of magnetic field sensing elements for generating a corresponding plurality of magnetic field sensing element signal values, wherein the plurality of sine values of the sinusoid is irrespective of the plurality of magnetic field sensing element signal values;
   selecting a peak magnetic field sensing element from among the plurality of magnetic field sensing elements that generates a largest one of the plurality of magnetic field sensing element signal values as a peak magnetic field sensing element signal value;
   selecting a ninety degree magnetic field sensing element from among the plurality of magnetic field sensing elements that has a primary response axis about ninety degrees rotated from a direction of a primary response axis of the peak magnetic field sensing element, the ninety degree magnetic field sensing element generating a ninety degree magnetic field sensing element signal value;
   computing a difference between the peak magnetic field sensing element signal value and the ninety degree magnetic field sensing element signal value; and
   comparing the computed difference with the table of difference values to identify the direction of the directional magnetic field, wherein at least one of the above steps is performed by a processor.

2. The method of claim 1, wherein the generating the table of difference values comprises:
   generating an initialization magnetic field;
   receiving the initialization magnetic field with the plurality of magnetic field sensing elements;
   identifying a peak amplitude of the plurality of magnetic field sensing element signal values when the initialization magnetic field is being generated; and
   scaling the plurality of difference values of the table of difference values by the peak amplitude.

3. The method of claim 2, wherein the identifying the peak magnetic field sensing element comprises:
   identifying a first one of the plurality of magnetic field sensing elements that generates a respective magnetic field sensing element signal value that is within a predetermined range of the peak amplitude;
   identifying left and right edge magnetic field sensing elements by testing respective magnetic field signals generated by a plurality of other ones of the plurality of magnetic field sensing elements proximate to the identified first one of the magnetic field sensing, each generating a respective magnetic field sensing element signal value that has an amplitude equal to the peak amplitude, wherein magnetic field sensing elements from among the plurality of magnetic field sensing elements and adjacent to the left edge magnetic field sensing element and adjacent to the right edge magnetic field sensing element generate respective magnetic field sensing element signal values smaller than the peak amplitude; and
   selecting as the peak magnetic field sensing element a magnetic field sensing element between the left and right edge magnetic field sensing elements.

4. The method of claim 1, wherein the directional magnetic field has a first direction subject to a rotation to a second different direction, the method further comprising:
   converting the peak magnetic field sensing element signal value with a first analog-to-digital converter to generate a first converted signal;
   selecting a second different magnetic sensing element among the plurality of magnetic field sensing elements as a next peak magnetic field sensing element that is expected to generate a new largest magnetic field sensing element signal value as a next peak magnetic field sensing element signal value when the directional magnetic field rotates to the second different direction;
   converting the next peak magnetic field sensing element signal value with a second different analog-to-digital converter to generate a second converted signal; and
   calculating whether the direction of the magnetic field is closer to the first direction or to the second direction.

5. The method of claim 4, wherein the computing the difference between the peak magnetic field sensing element signal value and the ninety degree magnetic field sensing element signal value comprises:
   selecting the peak magnetic field sensing element signal value or the next peak magnetic field sensing element signal value to use as the identified peak magnetic field sensing element in the computing and in the comparing, wherein the selecting is done in accordance with the calculating whether the direction of the magnetic field is closer to the first direction or to the second direction.

6. The method of claim 1, wherein the plurality of magnetic field sensing elements forms a circular vertical Hall (CVH) sensing element arrangement over a common implant region in a substrate.

7. A method of determining a direction of a directional magnetic field, comprising:
   tracking the direction of the directional magnetic field, wherein the directional magnetic field has a first direction subject to a rotation to a second different direction, wherein the tracking comprises:
   receiving the directional magnetic field with a plurality of magnetic field sensing elements for generating a corresponding plurality of magnetic field sensing element signal values;
   selecting a peak magnetic sensing element among the plurality of magnetic field sensing elements that is expected to generate a largest magnetic field sensing element signal value as a peak magnetic field sensing element signal value;
   converting the peak magnetic field sensing element signal value with a first analog-to-digital converter to generate a first converted signal;
   selecting a next peak magnetic sensing element among the plurality of magnetic field sensing elements that is expected to generate a new largest magnetic field sensing element signal value as a next peak magnetic field sensing element signal value when the magnetic field rotates to the second different direction;
   converting the next peak magnetic field sensing element signal value with a second different analog-to-digital converter to generate a second converted signal;

calculating whether the direction of the magnetic field is closer to the first direction or to the second direction; and switching back and forth between the converting the peak magnetic field sensing element signal value and the converting the next peak magnetic field sensing element signal value using two different analog-to-digital converters, wherein at least one of the above steps is performed by a processor.

8. The method of claim 7, further comprising:
selecting the peak magnetic field sensing element signal value or the next peak magnetic field sensing element signal value in accordance with the calculating whether the direction of the magnetic field is closer to the first direction or to the second direction; and
processing the selected magnetic field sensing element signal value to identify the direction of the directional magnetic field.

9. The method of claim 7, further comprising:
generating a table of difference values comprising a plurality of difference values, each difference value of the plurality of difference values computed as a respective difference between an identified respective sine value of a sinusoid, the sinusoid having a plurality of sine values, and a ninety-degree sine value of the sinusoid taken ninety degrees apart from the identified respective sine value, wherein one of the sine values is at a peak value of the sinusoid and other identified sine values are at selected phase increments of the sinusoid, wherein the plurality sine values of the sinusoid is irrespective of the plurality of magnetic field sensing element signal values;
selecting the peak magnetic field sensing element from among the plurality of magnetic field sensing element signal values as the peak magnetic field sensing element;
selecting a ninety degree magnetic field sensing element from among the plurality of magnetic field sensing elements that has a primary response axis about ninety degrees rotated from the from a direction of a primary response axis of the selected peak magnetic field sensing element, the identified ninety degree magnetic field sensing element generating a ninety degree magnetic field sensing element signal value;
computing a difference between the peak magnetic field sensing element signal value and the ninety degree magnetic field sensing element signal value; and
comparing the computed difference with the table of difference values to identify the direction of the magnetic field.

10. The method of claim 9, wherein the generating the table of difference values comprises:
generating an initialization magnetic field;
receiving the initialization magnetic field with the plurality of magnetic field sensing elements;
identifying a peak amplitude of the plurality of magnetic field sensing element signal value when the initialization magnetic field is being generated; and
scaling the plurality of difference values of the table of difference values by the peak amplitude.

11. The method of claim 10, wherein the identifying the magnetic field sensing element comprises:
identifying a first one of the plurality of magnetic field sensing elements that generates a respective magnetic field sensing element signal value that is within a predetermined range of the peak amplitude;
identifying left and right edge magnetic field sensing elements by testing respective magnetic field signals generated by a plurality of other ones of the plurality of magnetic field sensing elements proximate to the identified first one of the magnetic field sensing element, each generating a respective magnetic field sensing element signal value that has an amplitude equal to the peak amplitude, wherein magnetic field sensing elements from among the plurality of magnetic field sensing elements and adjacent to the left edge magnetic field sensing element and adjacent to the right edge magnetic field sensing element generate respective magnetic field sensing element signal values smaller than the peak amplitude; and
selecting as the peak magnetic field sensing element a magnetic field sensing element between the left and right edge magnetic field sensing elements.

12. The method of claim 7, wherein the plurality of magnetic field sensing elements forms a circular vertical Hall (CVH) sensing element arrangement over a common implant region in a substrate.

13. An electronic circuit for determining a largest direction of a directional magnetic field, the electronic circuit comprising:
an initialization processor coupled to:
receive a plurality of magnetic field sensing element signals generated by a corresponding plurality of magnetic field sensing elements for generating a plurality of magnetic field sensing element signal values, where in the initialization processor is configured to:
generate a table of difference values comprising a plurality of difference values, each difference value computed as a respective difference between an identified respective sine value of a sinusoid, the sinusoid having a plurality of sine values, and a ninety-degree sine value of the sinusoid taken ninety degrees apart from the identified respective sine value, wherein one of the identified sine values is at a peak value of the sinusoid and other identified sine values are at selected phase increments of the sinusoid, wherein the plurality of sine values of the sinusoid is irrespective of the plurality of magnetic field sensing element signal values, wherein the electronic circuit further comprises:
a find peak processor coupled to the initialization processor and configured to:
select a peak magnetic field sensing element from among the plurality of magnetic field sensing elements that generates a largest one of the plurality of magnetic field sensing element signal values as a peak magnetic field sensing element signal value; and
a track peak processor coupled to receive the table of difference values, coupled to receive the peak magnetic field sensing element signal value, and configured to:
select a ninety degree magnetic field sensing element from among the plurality of magnetic field sensing elements that has a primary response axis about ninety degrees rotated from a direction of a primary response axis of the peak magnetic field sensing element, the ninety degree magnetic field sensing element generating a ninety degree magnetic field sensing element signal value;
compute a difference between the peak magnetic field sensing element signal value and the ninety degree magnetic field sensing element signal value, and to
compare the computed difference with the table of difference values to identify the direction of the magnetic field.

14. The electronic circuit of claim 13, wherein the initialization processor is further configured to:

identify a peak amplitude of the plurality of magnetic field sensing element signal values when the plurality of magnetic field sensing elements experience an initialization magnetic field; and to scale the plurality of difference values of the table of difference values by the peak amplitude.

15. The electronic circuit of claim 13, wherein the find peak processor is further configured to:

identify a first one of the plurality of magnetic field sensing elements that generates a respective magnetic field sensing element signal value that is within a predetermined range of the peak amplitude;

identify left and right edge magnetic field sensing elements by testing a plurality of other ones of the plurality of magnetic field sensing elements proximate to the identified first one of the magnetic field sensing elements, the left edge magnetic field sensing element and the right edge magnetic field sensing element each generating a respective magnetic field sensing element signal value that has an amplitude equal to the peak amplitude, wherein magnetic field sensing elements from among the plurality of magnetic field sensing elements and adjacent to the left edge magnetic field sensing element and adjacent to the right edge magnetic field sensing element generate respective magnetic field sensing element signal values smaller than the peak amplitude; and to select as the peak magnetic field sensing element a magnetic field sensing element between the left and right edge magnetic field sensing elements.

16. The electronic circuit of claim 13, wherein the directional magnetic field has a first direction subject to a rotation to a second different direction, the electronic circuit further comprising:

a first analog-to digital converter configured to:
convert the peak magnetic field sensing element signal value to generate a first converted signal, wherein the track peak processor is further configured to:
select a second different magnetic sensing element among the plurality of magnetic field sensing elements and proximate to the identified peak magnetic field sensing element as a next peak magnetic field sensing element that is expected to generate a new largest magnetic field sensing element signal value as a next peak magnetic field sensing element signal value when the directional magnetic field rotates to the second different direction, wherein the electronic circuit further comprises:
a second analog-to-digital configured to:
convert the next peak magnetic field sensing element signal value to generate a second converted signal, wherein the track peak processor is coupled to receive the first and second converted signals and is further configured to:
calculate whether the direction of the magnetic field is closer to the first direction or to the second direction, and to switch back and forth between the converting the peak magnetic field sensing element signal value and the converting the next peak magnetic field sensing element signal value.

17. The electronic circuit of claim 16, wherein the track peak processor is further configured to:

select the peak magnetic field sensing element signal value or the next peak magnetic field sensing element signal value to use as the identified peak magnetic field sensing element in the computing and in the comparing.

18. The electronic circuit of claim 13, wherein the plurality of magnetic field sensing elements forms a circular vertical Hall (CVH) sensing element arrangement over a common implant region in a substrate.

19. An electronic circuit for determining a direction of a directional magnetic field that has a first direction subject to a rotation to a second different direction, comprising:

a plurality of magnetic field sensing elements configured to generate a corresponding plurality of magnetic field sensing element signal values, the plurality of magnetic field sensing element signal values responsive to the directional magnetic field;

a track peak processor configured to:
select a peak magnetic sensing element among the plurality of magnetic field sensing elements that is expected to generate a largest magnetic field sensing element signal value as a peak magnetic field sensing element signal value;

a first analog-to digital converter configured to:
convert the peak magnetic field sensing element signal value to generate a first converted signal;

the track peak processor further configured to:
select a second different magnetic sensing element among the plurality of magnetic field sensing elements and proximate to the identified peak magnetic field sensing element as a next peak magnetic field sensing element that is expected to generate a new largest magnetic field sensing element signal value as a next peak magnetic field sensing element signal value when the directional magnetic field rotates to the second different direction;

a second analog-to-digital configured to:
convert the next peak magnetic field sensing element signal value to generate a second converted signal, Wherein the track peak processor is coupled to receive the first and second converted signals and is further configured to:
calculate whether the direction of the magnetic field is closer to the first direction or to the second direction, and to switch back and forth between the converting the peak magnetic field sensing element signal value and the converting the next peak magnetic field sensing element signal value using two different analog-to-digital converters.

20. The electronic circuit of claim 19, where the track peak processor is further configured to:

select the peak magnetic field sensing element signal value or the next peak magnetic field sensing element signal value in accordance with the calculating whether the direction of the magnetic field is closer to the first direction or to the second direction; and to process the selected magnetic field sensing element signal value.

21. The electronic circuit of claim 19, further comprising:

a find peak processor coupled to the initialization processor and configured to:
select the peak magnetic field sensing element from among the plurality of magnetic field sensing elements that generates the largest magnetic field sensing element signal value;

wherein the track peak processor is coupled to receive the table of difference values and further configured to:
select a ninety degree magnetic field sensing element from among the plurality of magnetic field sensing elements that has a primary response axis about ninety degrees rotated f from a direction of a primary response axis of the peak magnetic field sensing element, the ninety degree magnetic field sensing element generating a ninety degree magnetic field sensing element signal value;
compute a difference between the peak magnetic field sensing element signal value and the ninety degree magnetic field sensing element signal value; and to
compare the computed difference with the table of difference values to identify the direction of the magnetic field.

22. The electronic circuit of claim 21, wherein the initialization processor is further configured to:
identify a peak amplitude of the plurality of magnetic field sensing element signal values when the plurality of magnetic field sensing elements experience an initialization magnetic field; and to
scale the plurality of different values of the table of difference values by the peak amplitude.

23. The electronic circuit of claim 21, wherein the find peak processor is further configured to:
identify a first one of the plurality of magnetic field sensing elements that generates a respective magnetic field sensing element signal value that is within a predetermined range of the peak amplitude;
identify left and right edge magnetic field sensing elements by testing a plurality of other ones of the plurality of magnetic field sensing elements proximate to the identified first one of the magnetic field sensing elements, the left edge magnetic field sensing element and the right edge magnetic field sensing element each generating a respective magnetic field sensing element signal value that has an amplitude equal to the peak amplitude, wherein magnetic field sensing elements from among the plurality of magnetic field sensing elements and adjacent to the left edge magnetic field sensing element and adjacent to the right edge magnetic field sensing element generate respective magnetic field sensing element signal values smaller than the peak amplitude; and to
select as the peak magnetic field sensing element a magnetic field sensing element between the left and right edge magnetic field sensing elements.

24. The electronic circuit of claim 19, wherein the plurality of magnetic field sensing elements forms a circular vertical (CVH) sensing element arrangement over a common implant region in a substrate.

25. A method of processing signals generated by a plurality of magnetic field sensing elements, comprising:
exposing the plurality of magnetic field sensing elements to a rotating magnetic field;
recording maxima and minima signal values for each one of the plurality of magnetic field sensing elements as the rotating magnetic field rotates;
selecting a first one of the plurality of magnetic field sensing elements as a basis magnetic field sensing element having a basis maximum signal value and a basis minimum signal value;
computing a plurality of initial offset correction values associated with the plurality of magnetic field sensing elements by computing a difference between the basis maximum signal value and the maximum value for each one of the maximum signal values; and
correcting the signals generated by the plurality of magnetic field sensing elements by using the initial offset correction values, wherein at least one of the above steps is performed by a processor.

26. The method of claim 25, further comprising:
identifying a second one of the plurality of magnetic field sensing elements that is approximately one hundred eighty degrees rotated from the basis magnetic field sensing element;
computing an actual peak magnitude value by computing a difference between the basis maximum signal value and an absolute value of a minimum value of the second magnetic field sensing element, first corrected by a respective one of the initial offset correction values, the difference divided by two;
computing a secondary offset correction value by computing a difference between the actual peak magnitude value and the basis maximum signal value; and
correcting the signals generated by the plurality of magnetic field sensing elements by using the initial offset correction values and the secondary offset correction value.

27. The method of claim 26, wherein the plurality of magnetic field sensing elements forms a circular vertical Hall (CVH) sensing element arrangement over a common implant region in a substrate.

28. An electronic circuit for processing signals generated by a plurality of magnetic field sensing elements, comprising:
an initialization processor coupled to:
receive the signals generated by a plurality of magnetic field sensing elements while the plurality of magnetic field sensing elements are exposed to a rotating magnetic field, wherein the initialization processor is configured to:
select a first one of the plurality of magnetic field sensing elements as a basis magnetic field sensing element having a basis maximum signal value and a basis minimum signal value;
compute a plurality of initial offset correction values associated with the plurality of magnetic field sensing elements by computing a difference between the basis maximum signal value and the maximum value for each one of the maxima signal values; and to
correct the signals generated by the plurality of magnetic field sensing elements by using the initial offset correction values.

29. The electronic circuit of claim 28, wherein the initialization processor is further configured to:
identify a second one of the plurality of magnetic field sensing elements that is approximately one hundred eighty degrees rotated from the basis magnetic field sensing element;
compute an actual peak magnitude value by computing a difference between the basis maximum signal value and an absolute value of a minimum value t, first corrected by a respective one of the initial offset correction values, the difference divided by two;
compute a secondary offset correction value by computing a difference between the actual peak magnitude value and the basis maximum signal value; and to
correct the signals generated by the plurality of magnetic field sensing elements by using the initial offset correction values and the secondary offset correction value.

30. The electronic circuit of claim 29, wherein the plurality of magnetic field sensing elements forms a circular vertical Hall (CVH) sensing element arrangement over a common implant region in a substrate.

* * * * *